(12) United States Patent
Kouznetsov et al.

(10) Patent No.: US 7,615,436 B2
(45) Date of Patent: Nov. 10, 2009

(54) TWO MASK FLOATING GATE EEPROM AND METHOD OF MAKING

(75) Inventors: Igor G. Kouznetsov, Santa Clara, CA (US); Andrew J. Walker, Mountain View, CA (US)

(73) Assignee: SanDisk 3D LLC, Milpitas, CA (US)

(*) Notice: Subject to any disclaimer, the term of this patent is extended or adjusted under 35 U.S.C. 154(b) by 364 days.

(21) Appl. No.: 10/849,152

(22) Filed: May 20, 2004

(65) Prior Publication Data

US 2004/0207001 A1    Oct. 21, 2004

Related U.S. Application Data

(60) Division of application No. 10/066,376, filed on Feb. 5, 2002, now Pat. No. 6,897,514, which is a continuation-in-part of application No. 09/927,648, filed on Aug. 13, 2001, now Pat. No. 6,881,994.

(60) Provisional application No. 60/279,855, filed on Mar. 28, 2001.

(51) Int. Cl.
*H01L 21/8238* (2006.01)
(52) U.S. Cl. ............... 438/201; 438/211; 438/257; 257/E27.078; 257/E21.179
(58) Field of Classification Search ........... 438/201, 438/211, 257, 261, 262, 263, 264; 257/E27.078, 257/E21.179
See application file for complete search history.

(56) References Cited

U.S. PATENT DOCUMENTS

| 3,414,892 | A | 12/1968 | McCormack et al. |
| 3,432,827 | A | 3/1969 | Sarno |
| 3,571,809 | A | 3/1971 | Nelson |
| 3,573,757 | A | 4/1971 | Adams |
| 3,576,549 | A | 4/1971 | Hess |
| 3,582,908 | A | 6/1971 | Koo |

(Continued)

FOREIGN PATENT DOCUMENTS

EP    0 073 486 A2    8/1982

(Continued)

OTHER PUBLICATIONS

John H. Douglas: "The Route to 3-D Chips," High Technology. Sep. 1983, pp. 55-59, vol. 3, No. 9, High Technology Publishing Corporation, Boston, MA.

(Continued)

*Primary Examiner*—Long Pham
(74) *Attorney, Agent, or Firm*—Foley & Lardner LLP

(57) ABSTRACT

There is provided a floating gate transistor, such as an EEPROM transistor, and method of making the transistor using two masking steps. The method of making a transistor includes patterning a floating gate layer using a first photoresist mask to form a floating gate rail and doping an active area using the floating gate rail as a mask to form source and drain regions in the active area. The method also includes patterning a control gate layer, a control gate dielectric layer, the floating gate rail, a tunnel dielectric layer and the active area using a second photoresist mask to form a control gate, a control gate dielectric, a floating gate, a tunnel dielectric and a channel island region.

42 Claims, 12 Drawing Sheets

U.S. PATENT DOCUMENTS

| | | | |
|---|---|---|---|
| 3,629,863 | A | 12/1971 | Neale |
| 3,634,929 | A | 1/1972 | Yoshida at al. |
| 3,671,948 | A | 6/1972 | Cassen et al. |
| 3,699,543 | A | 10/1972 | Neale |
| 3,717,852 | A | 2/1973 | Abbas at al. |
| 3,728,695 | A | 4/1973 | Frohman-Bentchkowsky |
| 3,787,822 | A | 1/1974 | Rioult |
| 3,846,767 | A | 11/1974 | Cohen |
| 3,863,231 | A | 1/1975 | Taylor |
| 3,877,049 | A | 4/1975 | Buckley |
| 3,886,577 | A | 5/1975 | Buckley |
| 3,922,648 | A | 11/1975 | Buckley |
| 3,980,505 | A | 9/1976 | Buckley |
| 3,990,098 | A | 11/1976 | Mastrangelo |
| 4,146,902 | A | 3/1979 | Tanimoto et al. |
| 4,177,475 | A | 12/1979 | Holmberg |
| 4,203,123 | A | 5/1980 | Shanks |
| 4,203,158 | A | 5/1980 | Frohman-Bentchkowsky et al. |
| 4,272,880 | A | 6/1981 | Pashley |
| 4,281,397 | A | 7/1981 | Neal et al. |
| 4,355,375 | A * | 10/1982 | Arakawa ............... 365/185.01 |
| 4,419,741 | A | 12/1983 | Stewart et al. |
| 4,420,766 | A | 12/1983 | Kasten |
| 4,442,507 | A | 4/1984 | Roesner |
| 4,489,478 | A | 12/1984 | Sakurai |
| 4,494,135 | A | 1/1985 | Moussie |
| 4,498,226 | A | 2/1985 | Inoue et al. |
| 4,499,557 | A | 2/1985 | Holmberg et al. |
| 4,500,905 | A | 2/1985 | Shibata |
| 4,507,757 | A | 3/1985 | McElroy |
| 4,535,424 | A | 8/1985 | Reid |
| 4,543,594 | A | 9/1985 | Mohsen et al. |
| 4,569,121 | A | 2/1986 | Lim et al. |
| 4,630,096 | A | 12/1986 | Drye |
| 4,639,893 | A * | 1/1987 | Eitan .................... 365/185.16 |
| 4,646,266 | A | 2/1987 | Ovshinsky et al. |
| 4,672,577 | A | 6/1987 | Hirose |
| 4,677,742 | A | 7/1987 | Johnson |
| 4,710,798 | A | 12/1987 | Marcantonio |
| 4,729,005 | A | 3/1988 | Wei et al. |
| 4,811,082 | A | 3/1989 | Jacobs |
| 4,811,114 | A | 3/1989 | Yamamoto et al. |
| 4,820,657 | A | 4/1989 | Hughes et al. |
| 4,823,181 | A | 4/1989 | Mohsen et al. |
| 4,876,220 | A | 10/1989 | Mohsen et al. |
| 4,881,114 | A | 11/1989 | Mohsen et al. |
| 4,899,205 | A | 2/1990 | Hamdy et al. |
| 4,922,319 | A | 5/1990 | Fukushima |
| 4,943,538 | A | 7/1990 | Mohsen et al. |
| 5,001,539 | A | 3/1991 | Inoue et al. |
| 5,070,383 | A | 12/1991 | Sinar et al. |
| 5,070,384 | A | 12/1991 | McCollum et al. |
| 5,089,862 | A | 2/1992 | Warner, Jr. et al. |
| 5,091,762 | A | 2/1992 | Watanabe |
| 5,160,987 | A | 11/1992 | Pricer et al. |
| 5,191,405 | A | 3/1993 | Tomita et al. |
| 5,202,754 | A | 4/1993 | Bertin et al. |
| 5,266,912 | A | 11/1993 | Kledzik |
| 5,283,468 | A | 2/1994 | Kondo et al. |
| 5,306,935 | A | 4/1994 | Esquivel et al. |
| 5,311,039 | A | 5/1994 | Kimura et al. |
| 5,334,880 | A | 8/1994 | Abadeer et al. |
| 5,383,149 | A | 1/1995 | Hong |
| 5,391,518 | A | 2/1995 | Bhushan |
| 5,391,907 | A | 2/1995 | Jang |
| 5,398,200 | A | 3/1995 | Mazure et al. |
| 5,422,435 | A | 6/1995 | Takiar et al. |
| 5,426,566 | A | 6/1995 | Beilstein, Jr. |
| 5,427,979 | A | 6/1995 | Chang |
| 5,434,745 | A | 7/1995 | Shokrgozar et al. |
| 5,441,907 | A | 8/1995 | Sung et al. |
| 5,453,952 | A | 9/1995 | Okudaira |
| 5,455,455 | A | 10/1995 | Badehi |
| 5,463,244 | A | 10/1995 | De Araujo et al. |
| 5,468,997 | A | 11/1995 | Imai et al. |
| 5,471,090 | A | 11/1995 | Deutsch |
| 5,481,133 | A | 1/1996 | Hsu |
| 5,495,398 | A | 2/1996 | Takiar et al. |
| 5,502,289 | A | 3/1996 | Takiar et al. |
| 5,523,622 | A | 6/1996 | Harada et al. |
| 5,523,628 | A | 6/1996 | Williams et al. |
| 5,535,156 | A | 7/1996 | Levy et al. |
| 5,536,968 | A | 7/1996 | Crafts et al. |
| 5,552,963 | A | 9/1996 | Burns |
| 5,557,122 | A * | 9/1996 | Shrivastava et al. ......... 257/309 |
| 5,559,048 | A | 9/1996 | Inoue |
| 5,561,622 | A | 10/1996 | Bertin et al. |
| 5,572,046 | A | 11/1996 | Takemura |
| 5,581,498 | A | 12/1996 | Ludwig et al. |
| 5,585,675 | A | 12/1996 | Knopf |
| 5,654,220 | A | 8/1997 | Leedy |
| 5,675,547 | A | 10/1997 | Koga |
| 5,693,552 | A | 12/1997 | Hsu |
| 5,696,031 | A | 12/1997 | Wark |
| 5,703,747 | A | 12/1997 | Voldman et al. |
| 5,737,259 | A | 4/1998 | Chang |
| 5,745,407 | A | 4/1998 | Levy et al. |
| 5,751,012 | A | 5/1998 | Wolstenholme et al. |
| 5,776,810 | A | 7/1998 | Guterman et al. |
| 5,780,925 | A | 7/1998 | Cipolla et al. |
| 5,781,031 | A | 7/1998 | Bertin et al. |
| 5,801,437 | A | 9/1998 | Burns |
| 5,835,396 | A | 11/1998 | Zhang |
| 5,883,409 | A | 3/1999 | Guterman et al. |
| 5,889,302 | A | 3/1999 | Liu |
| 5,915,167 | A | 6/1999 | Leedy |
| 5,930,608 | A | 7/1999 | Yamazaki et al. |
| 5,936,280 | A | 8/1999 | Liu |
| 5,969,380 | A | 10/1999 | Syyedy |
| 5,976,953 | A | 11/1999 | Zavracky et al. |
| 5,978,258 | A | 11/1999 | Manning |
| 5,981,974 | A | 11/1999 | Makita |
| 5,985,693 | A | 11/1999 | Leedy |
| 6,005,270 | A | 12/1999 | Noguchi |
| 6,028,326 | A | 2/2000 | Uochi et al. |
| 6,034,882 | A | 3/2000 | Johnson et al. |
| 6,057,598 | A | 5/2000 | Payne et al. |
| 6,072,234 | A | 6/2000 | Camien et al. |
| 6,087,722 | A | 7/2000 | Lee et al. |
| 6,107,666 | A | 8/2000 | Chang |
| 6,110,278 | A | 8/2000 | Saxena |
| 6,114,767 | A | 9/2000 | Nagai et al. |
| 6,133,640 | A | 10/2000 | Leedy |
| 6,185,122 | B1 | 2/2001 | Johnson et al. |
| 6,197,641 | B1 | 3/2001 | Hergenrother et al. |
| 6,208,545 | B1 | 3/2001 | Leedy |
| RE37,259 | E | 7/2001 | Ovshinsky |
| 6,281,042 | B1 | 8/2001 | Ahn et al. |
| 6,291,858 | B1 | 9/2001 | Ma et al. |
| 6,307,257 | B1 | 10/2001 | Huang et al. |
| 6,314,013 | B1 | 11/2001 | Ahn et al. |
| 6,322,903 | B1 | 11/2001 | Siniaguine et al. |
| 6,337,521 | B1 | 1/2002 | Masuda |
| 6,351,028 | B1 | 2/2002 | Akram |
| 6,353,265 | B1 | 3/2002 | Michil |
| 6,355,501 | B1 | 3/2002 | Fung et al. |
| 6,420,215 | B1 | 7/2002 | Knall et al. |
| 6,612,570 | B1 | 9/2003 | Cox |
| 6,627,518 | B1 | 9/2003 | Inoue et al. |
| 6,653,733 | B1 | 11/2003 | Gonzalez et al. |
| 6,713,810 | B1 | 3/2004 | Bhattacharyya |
| 6,888,750 | B2 | 5/2005 | Walker et al. |
| 7,125,763 | B1 * | 10/2006 | Sobek et al. ................ 438/201 |
| 2001/0033030 | A1 | 10/2001 | Leedy |

| | | | |
|---|---|---|---|
| 2001/0054759 | A1 | 12/2001 | Nishiura |
| 2001/0055838 | A1 | 12/2001 | Walker et al. |
| 2002/0024146 | A1 | 2/2002 | Furusawa |
| 2002/0027275 | A1 | 3/2002 | Fujimoto et al. |
| 2002/0028541 | A1 | 3/2002 | Lee et al. |
| 2002/0030262 | A1 | 3/2002 | Akram |
| 2002/0030263 | A1 | 3/2002 | Akram |
| 2003/0030074 | A1 | 2/2003 | Walker et al. |
| 2003/0057435 | A1 | 3/2003 | Walker |
| 2003/0173643 | A1 | 9/2003 | Herner |
| 2003/0218920 | A1* | 11/2003 | Harari .................... 365/200 |
| 2004/0000679 | A1 | 1/2004 | Patel et al. |

FOREIGN PATENT DOCUMENTS

| | | |
|---|---|---|
| EP | 0 387 834 A2 | 9/1990 |
| EP | 0 395 886 A2 | 11/1990 |
| EP | 0 516 866 A1 | 12/1992 |
| EP | 0 606 653 A1 | 7/1994 |
| EP | 0 644 548 A2 | 9/1994 |
| EP | 0 800 137 A1 | 3/1997 |
| EP | 0 971 416 A1 | 1/2000 |
| JP | 61-222216 | 10/1986 |
| JP | 6-22352 | 1/1994 |
| JP | 63-52463 | 3/1998 |
| KR | 10-190016 | 6/1999 |
| WO | WO 94/26083 | 11/1994 |

OTHER PUBLICATIONS

M. Arienzo et al.: "Diffusion of Arsenic in Bilayer Polycrystalline Silicon Films," J. Appl. Phys., Jan. 1984, pp. 365-369, vol. 55, No. 2, American Institute of Physics.

O. Bellezza et al.: "A New Self-Aligned Field Oxide Cell for Multimegabit Eproms," IEDM, pp. 579-582, IEEE.

S.D. Brotherton et al.: "Excimer-Laser-Annealed Poly-Si Thin-Film Transistors," IEEE Transactions on Electron Devices, Feb. 1993, pp. 407-413, vol. 40, No. 2, IEEE.

P. Candelier et al.: "Simplified 0.35-µm Flash EEPROM Process Using High-Temperature Oxide (HTO) Deposited by LPCVD as Interpoly Dielectrics and Peripheral Transistors Gate Oxide," IEEE Electron Device Letters, Jul. 1997, pp. 306-308, vol. 18, No. 7, IEEE.

Min Cao et al.: "A High-Performance Polysilicon Thin-Film Transistor Using XeCl Excimer Laser Crystallization of Pre-Patterned Amorphous Si Films," IEEE Transactions on Electron Devices, Apr. 1996, pp. 561-567, vol. 43, No. 4, IEEE.

Mino Cao et al.: "A Simple EEPROM Cell Using Twin Polysilicon Thin Film Transistors," IEEE Electron Device Letters, Aug. 1994, pp. 304-306, vol. 15, No. 8, IEEE.

Bomy Chen et al.: "Yield Improvement for a 3.5-ns BICMOS Technology in a 200-mm Manufacturing Line," IBM Technology Products, 1993, pp. 301-305, VLSITSA.

Victor W.C. Chan et al.: "Three Dimensional CMOS Integrated Circuits on Large Grain Polysilicon Films," IEDM, 2000, IEEE.

Boaz Eitan et al.: "Alternate Metal Virtual Ground (AMG)—A New Scaling Concept for Very High-Density EPROM's," IEEE Electron Device Letters, pp. 450-452, vol. 12, No. 8, Aug. 1991, IEEE.

Boaz Eitan et al.: "NROM: A Novel Localized Trapping, 2-Bit Nonvolatile Memory Cell," IEEE Electron Device Letters, pp. 543-545, vol. 21, No. 11, Nov. 2000, IEEE.

Boaz Eitan et al.: "Multilevel Flash cells and their Trade-offs," IEEE Electron Device Letters , pp. 169-172, 1996, IEEE.

Dr. Heinrich Endert: "Excimer Lasers as Tools for Material Processing in Manufacturing," Technical Digest: International Electron Devices Meeting, 1985, pp. 28-29, Washington, DC, Dec. 1-4, 1985, Göttingen, Germany.

Dov Frohman-Bentchkowsky: "A Fully Decoded 2048-Bit Electrically Programmable FAMOS Read-Only Memory," IEEE Journal of Solid-State Circuits, pp. 301-306, vol. sc-6, No. 5, Oct. 1971.

G.K. Giust et al.: "Laser-Processed Thin-Film Transistors Fabricated from Sputtered Amorphous-Silicon Films," IEEE Transactions on Electron Devices, pp. 207-213, vol. 47, No. 1, Jan. 2000, IEEE.

G.K. Giust et al.: "High-Performance Thin-Film Transistors Fabricated Using Excimer Laser Processing and Grain Engineering," IEEE Transactions on Electron Devices, pp. 925-932, vol. 45, No. 4, Apr. 1998, IEEE.

G.K. Giust et al.: "High-Performance Laser-Processed Polysilicon Thin-Film Transistors," IEE Electron Device Letters, pp. 77-79, vol. 20, No. 2, Feb. 1999, IEEE.

C. Hayzelden et al.: "Silicide Formation and Silicide-Mediated Crystallization of Nickel-Implanted Amorphous Silicon Thin Films," J. Appl. Phys. 73(12), Jun. 15, 1993, pp. 8279-8289, 1993 American Institute of Physics.

Fumihiko Hayashi et al.: "A Self-Aligned Split-Gate Flash EEPROM Cell with 3-D Pillar Structure," 1999 Symposium on VLSI Technology Digest of Technical Papers, pp. 87-88, Stanford University, Stanford, CA 94305, USA.

Stephen C.H. Ho et al.: "Thermal Stability of Nickel Silicides in Different Silicon Substrates," Department of Electrical and Electronic Engineering, pp. 105-108, 1998, IEEE.

Sung-Hoi Hur et al.: "A Poly-Si Thin-Film Transistor EEPROM Cell with a Folded Floating Gate," IEEE Transactions on Electron Devices, pp. 436-438, vol. 46, No. 2, Feb. 1999, IEEE.

J. Esquivel et al. "High Density Contactless, Self Aligned EPROM Cell Array Technology," Texas Instruments (Dallas), IEDM 86, pp. 592-595, 1986, IEEE.

R. Kazerounian et al.: Alternate Metal Virtual Ground EPROM Array Implemented in a 0.8 µm Process for Very High Density Applications, IEDM 91, pp. 311-314, 1991, IEEE.

Chang-Dong Kim et al.: "Short-Channel Amorphous-Silicon Thin-Film Transistors," IEEE Transactions on Electron Devices, pp. 2172-2176, vol. 43, No. 12, Dec. 1996, IEEE.

Johan H. Klootwijk et al.: "Deposited Inter-Polysilicon Dielectrics for Nonvolatile Memories," IEEE Transactions on Electron Devices, pp. 1435-1445, vol. 46, No. 7, Jul. 1999, IEEE.

NEC Corporation: "A Novel Cell Structure for Giga-bit EPROMs and Flash Memories Using Polysilicon Thin Film Transistors," 1992 Symposium on VLSI Technology Digest of Technical Papers, pp. 44-45, 1992, IEEE.

Webpage-Ja-Hum Ku et al.: "High Performance pMOSFETs With Ni(Si/sub x/Ge/sub 1-x Si/Sub 0.8/Ge/sub 0.2/ gate, IEEE Xplore Citation," VLSI Technology, 200. Digest of Technical Paper Symposium on pp. 114-115 Jun. 13-15, 2000.

Nae-In Lee et al.: "High-Performance EEPROM's Using N- and P-Channel Polysilicon Thin-Film Transistors with Electron Cyclotron Resonance N2O-Plasma Oxide," pp. 15-17, IEEE Electron Device Letters, vol. 20, No. 1, Jan. 1999, IEEE.

Jin-Woo Lee et al.: "Improved Stability of Polysilicon Thin-Film Transistors under Self-Heating and High Endurance EEPROM Cells for Systems-On-Panel," IEEE Electron Device Letters, 1998, pp. 265-268, IEEE.

Seok-Woon Lee et al.: "Pd induced lateral crystallization of Amorphous Si Thin Films," Appl. Phys. Lett. 66 (13), pp. 1671-1673, Mar. 27, 1995, American Institute of Physics.

K. Miyashita et al.: "Optimized Halo Structure for 80 nm Physical Gate CMOS Technology with Indium and Antimony Highly Angled Ion Implantation," IEDM 99-645, pp. 27.2.1-27.2.4, 1999, IEEE.

N.D. Young et al.: "The Fabrication and Characterization of EEPROM Arrays on Glass Using a Low-Temperature Poly-Si TFT Process," IEEE Transactions on Electron Devices, pp. 1930-1936, vol. 43, No. 11, Nov. 1996, IEEE.

Jung-Hoon Oh et al.: "A High-Endurance Low-Temperature Polysilicon Thin-Film Transistor EEPROM Cell," pp. 304-306, IEEE Electron Device Letters, vol. 21, No. 6, Jun. 2000, IEEE.

Webpage—M.C. Poon. et al.: "Thermal Stability of Cobalt and Nickel Silicides in Amorpho Crystalline Silicon," p. 1, IEEE Xplore, Electron Devices Meeting, 1997, Proceedings, 19 Hong Kong, 2000, IEEE.

Noriaki Sato et al.: "A New Programmable Cell Utilizing Insulator Breakdown," IEDM, 1985 pp. 639-642, IEEE.

Takeo Shiba et al.: "In Situ Phosphorus-Doped Polysilicon Emitter Technology for Very High-Speed, Small Emitter Bipolar Transistors," IEEE Transactions on Electron Devices , pp. 889-897, vol. 43, No. 6, Jun. 1996, IEEE.

Seungheon Song et al.: "High Performance Transistors with State-of-the-Art CMOS Technologies," IEDM 99, pp. 427-430, 1999, IEEE.

Vivek Subramanian et al.: "Low-Leakage Germanium-Seeded Laterally-Crystallized Single-Grain 100-nm TFT's for Vertical Integration Applications," IEEE Electron Device Letters, pp. 341-343, vol. 20, No. 7, Jul. 1999, IEEE.

Yoshihiro Takao et al. "Low-Power and High-Stability SRAM Technology Using a Laser-Recrystallized p-Channel SOI MOSFET," IEEE Transactions on Electron Devices, pp. 2147-2152, vol. 39, No. 9, Sep. 1992, IEEE.

Kenji Taniguchi et al.: "Process Modeling and Simulation: Boundary Conditions for Point Defect-Based Impurity Diffusion Model," IEEE Transactions on Computer-Aided Design, pp. 1177-1183, vol. 9, No. 11, Nov. 1990, IEEE.

Hongmei Wang et al.: "Submicron Super TFTs for 3-D VLSI Applications," IEEE Electron Device Letters, pp. 391-393, vol. 21, No. 9, Sep. 2000, IEEE.

Hongmei Wang et al.: "Submicron Super TFTs for 3-D VLSI Applications," IEEE Electron Device Letters vol. 21, No. 9, pp. 439-441, Sep. 2000, IEEE.

Hongmei Wang et al.: "Super Thin-Film Transistor with SOI CMOS Performance Formed by a Novel Grain Enhancement Method," IEEE Transactions on Electron Devices, pp. 1580-1586, vol. 47, No. 8, Aug. 2000, IEEE.

Marvin H. White et al. "On the Go With Sonos," Circuit & Devices, pp. 22-31, Jul. 2000, IEEE.

B.J. Woo et al.: "A Novel Memory Cell Using Flash Array Contactless Eprom (Face) Technology," IEDM, pp. 90-93, 1990, IEEE.

Webpage—Qi Xiang et al.: "Deep sub-100 nm CMOS with Ultra Low Gate Sheet Resista NiSi," VLSI Technology, 2000. Digest of Technical Paper Symposium on . . . pp. 76-77, IEEE Xplore, Jun. 13-15, 2000.

Qi Xiang et al."Deep Sub-100nm CMOS with Ultra Low Gate Sheet Resistance by NiSi," IEEE, pp. 76-77, 2000, Symposium on VLSI Technology Digest of Technical Papers.

Qiuxia Xu et al.: "New Ti-Salicide Process Using Sb and Ge Preamorphization for Sub-0.2 μm CMOS Technology," IEEE Transactions on Electron Devices, pp. 2002-2009, vol. 45, No. 9, Sep. 1998, IEEE.

Kuniyoshi Yoshikawa et al.: "An Asymmetrical Lightly Doped Source Cell for Virtual Ground High-Density EPROM's," IEEE Transactions on Electron Devices, pp. 1046-1051, vol. 37, No. 4, Apr. 1990, IEEE.

Vivek Subramanian: "Control of Nucleation and Grain Growth in Solid-Phase Crystallized Silicon for High-Performance Thin Film Transistors," A Dissertation Submitted to the Department of Electrical Engineering and the Committee of Graduate Studies of Stanford University in Partial Fulfillment of the Requirements for the Degree of Doctor of Philosphy, Jun. 1998.

Brian Dipert: "Exotic Memories, Diverse Approaches," EDN Asia, Sep. 2001.

John R. Lindsey et al.: "Polysilicon Thin Film Transistor for Three Dimensional Memory," The 198th Meeting of The Electrochemical Society, vol. 2000-2.

Dietmar Gogl et al.: "A 1-Kbit EEPROM in SIMOX Technology for High-Temperature Applications up to 250° C.," IEEE Journal of Solid-State Circuits, Oct. 2000, vol. 35, No. 10, IEEE.

Stanley Wolf: "Silicon Processing for the VLSI Era," Semiconductor Memory Process Integration, vol. 2.

Web Page-ime.org.sg; "Tachyon and IME to Build 3D Chips for Greater Speed and Performance," Press Release, dated Jan. 18, 2002.

Ichiro Fujiwara et al.: "MONOS Memory Cell Scalable to 0.1 μm and Beyond," pp. 117-118.

Abou-Samra S.J.: "3D CMOS SOI for High Performance Computing", Low Power Electronics and Design Proceedings, 1998.

Yamazaki K.: "4-Layer 3-D IC Technologies for Parallel Signal Processing", International Electron Devices Meeting Technical Digest, Dec. 9-12, 1990, pp. 25.5.1-25.5.4.

Schlaeppi H.P.: "nd Core Memories using Multiple Coincidence", IRE Transactions on Electronic Computers, Jun. 1960, pp. 192-196.

Schlaeppppi H.P.: "Session V: Information Storage Techniques", International Solid-State Circuits Conference, Feb. 11, 1960, pp. 54-55.

De Graaf C. et al.: "A Novel High-Density, Low-Cost Diode Programmable Read Only Memory," IEDM, beginning at p. 189.

Peter K. Naji et al.: "A 256kb 3.0V 1T1MTJ Nonvolatile Magnetoresistive RAM," 2001 IEEE International Solid-State Circuits Conference, Digest of Technical Papers, ISSCC 2001/Session 7/Technology Directions: Advanced Technologies/7.6, Feb. 6, 2001, pp. 122-123 (including enlargement of figures, totaling 9 pages), and associated Visual Supplement, pp. 94-95,4040-405 (enlargements of slides submitted, totaling 25 pages).

Kim C. Hardee et al.: "A Fault-Tolerant 30 ns/375 mW 16K×1 NMOS Static RAM," IEEE Journal of Solid-State Circuits, Oct. 1981, vol. SC-16, No. 5, pp. 435-443.

Toshio Wada et al.: "A 15-ns 1024-Bit Fully Static MOS RAM," IEEE Journal of Solid-State Circuits, Oct. 1978, vol. SC-13, No. 5, pp. 635-639.

Camperi-Ginestet C.: "Vertical Electrical Interconnection of Compound Semiconductor Thin-Film Devices to Underlying Silicon Circuitry", IEEE Photonics Technology Letters, vol. 4, No. 9, Sep. 1992, pp. 1003-1006.

Akasaka Yoichi: Three-dimensional Integrated Circuit: Technology and Application Prospect, Microelectronics Journal, vol. 20, Nos. 1-2, 1989, pp. 105-112.

Sakamoto Kaji: "Architecture des Circuits a Trois Dimension (Architecture of Three Dimensional Devices)", Bulletin of the Electrotechnical Laboratory, ISSN 0366-9092, vol. 51, No. 1, 1987, pp. 16-29.

Akasaka Yoichi: "Three-dimensional IC Trends", Proceedings of the IEEE, vol. 74, No. 12, 1986, pp. 1703-1714.

Carter William H.: "National Science Foundation (NSF) Forum on Optical Science and Engineering", Proceedings SPIE—The International Society for Optical Engineering, vol. 2524, Jul. 11-12, 1995, (Article by N. Joverst titled "Manufacturable Multi-Material Integration Compound Semi-conductor Devices Bonded to Silicon Circuity".

Hayashi Y.: "A New Three Dimensional IC Fabrication Technology, Stacking Thin Film Dual-CMOS Layers", IEDM, 1991, pp. 25.6.1-25.6.4.

Reber M.: "Benefits of Vertically Stacked Integrated Circuits for Sequential Logic", IEEE, 1996, pp. 121-124.

Stern Jon M.: Design and Evaluation of an Epoxy Three-dimensional Multichip Module, IEEE Transactions on Components, Packaging, and Manufacturing Technology—Part B, vol. 19, No. 1, Feb. 1996, pp. 188-194.

Bertin Claude L.: "Evaluation of a Three-dimensional Memory Cube System", IEEE Transactions on Components, Hybrids, and Manufacturing Technology, vol. 16, No. 8, Dec. 1993, pp. 1006-1011.

Watanabe Hidehiro: "Stacked Capacitor Cells for High-density Dynamic RAMs", IEDM, 1988, pp. 600-603.

Web Page: "Stacked Memory Modules", IBM Technical Disclosure Bulletin, vol. 38, No. 5, 1995.

Thakur Shashidhar: "An Optimal Layer Assignment Algorithm for Minimizing Crosstalk for Three VHV Channel Routing", IEDM, 1995, pp. 207-210.

Terril Rob: "3D Packaging Technology Overview and Mass Memory Applications", IEDM, 1996, pp. 347-355.

Inoue Y.: "A Three-Dimensional Static RAM", IEEE Electron Device Letters, vol. 7, No. 5, May 1986, pp. 327-329.

Reber M.: "Benefits of Vertically Stacked Integrated Circuits for Sequential Logic", IEDM, 1996, pp. 121-124.

Kurokawa Takakazu: "3-D VLSI Technology in Japan and an Example: A Syndrome Decoder for Double Error Correction", FGCS—Future, Generation, Computer, Systems, vol. 4, No. 2, 1988, pp. 145-155, Amsterdam, The Netherlands.

Makiniak David: "Vertical Integration of Silicon Allows Packaging of Extremely Dense System Memory in Tiny Volumes: Memory-chip Stacks Send Density Skyward", Electronic Design, No. 17, Aug. 22, 1994, pp. 69-75, Cleveland Ohio.

Yamazaki K.: "Fabrication Technologies for Dual 4-KBIT Stacked SRAM", IEDM 16.8., 1986, pp. 435-438.

Pein Howard: "Performance of the 3-D Pencil Flash EPROM Cell an Memory Array", IEEE Transactions on Electron Devices, vol. 42, No. 11, Nov. 1995, pp. 1982-1991.

Abstract Lomatch S.: "Multilayered Josephson Junction Logic and Memory Devices", Proceedings of the SPIE-The International Society for Optical Engineering vol. 2157, pp. 332-343.

Abstract Lu N.C.C.: "Advanced Cell Structures for Dynamic RAMs", IEEE Circuits and Devices Magazine, vol. 5, No. 1, Jan. 1989, pp. 27-36.

Abstract Sakamato K.: "Architecture of Three Dimensional Devices", Journal: Bulletin of the Electrotechnical Laboratory, vol. 51, No. 1, 1987, pp. 16-29.

Abstract "Wide Application of Low-Cost Associative Processing Associative Processing Seen", Electronic Engineering Times, Aug. 26, 1996, p. 43.

Abstract "Interconnects & Packaging", Electronic Engineering Times, Nov. 27, 1995, p. 43.

Abstract "Closing in on Gigabit DRAMs", Electronic Engineering Times, Nov. 27, 1995, p. 35.

Abstract "Module Pact Pairs Cubic Memory with VisionTek", Semiconductor Industry & Business Survey, vol. 17, No. 15, Oct. 23, 1995.

Abstract "Layers of BST Materials Push Toward 1Gbit DRAM", Electronics Times, Oct. 19, 1995.

Abstract "Technologies Will Pursue Higher DRAM Densities", Electronic News (1991), Dec. 4, 1994, p. 12.

Abstract "Looking Diverse Storage", Electronic Engineering Times, Oct. 31, 1994, p. 44.

Abstract "Special Report: Memory Market Startups Cubic Memory: 3D Space Savers", Semiconductor Industry & Business Survey, vol. 16, No. 13, Sep. 12, 1994.

Abstract "Technique Boosts 3D Memory Density", Electronic Engineering Times, Aug. 29, 1994, p. 16.

Abstract "Memory Packs Poised 3D Use", Electronic Engineering Times, Dec. 7, 1992, p. 82.

Abstract "MCMs Hit the Road", Electronic Engineering Times, Jun. 15, 1992, p. 45.

Abstract "IEDM Ponders the 'Gigachip' Era", Electronic Engineering Times, Jan. 20, 1992, p. 33.

Abstract "Tech Watch: 1-Gbit DRAM in Sight", Electronic World News, Dec. 16, 1991, p. 20.

Abstract "MCMs Meld into Systems", Electronic Engineering Times, Jul. 22, 1991, p. 35.

Abstract "Systems EEs See Future in 3D", Electronic Engineering Times, Sep. 24, 1990, p. 37.

Chan et al. "Three Dimensional CMOS integrated Circuits on Large Grain Polysilicon Films" EEE, Hong Kong University of Science and Technology 2000 IEEE.

"3D Chip-On-Chip Stacking," Semiconductor International, Dec. 1991.

Richard W. Lay: "TRW Develops Wireless Multiboard Interconnect System," Electronic Engineering Times, Nov. 5, 1994.

* cited by examiner

TWO MASK FLOATING GATE EEPROM AND METHOD OF MAKING

This application is a divisional of U.S. application Ser. No. 10/066,376, filed Feb. 5, 2002, which is a continuation-in-part of U.S. application Ser. No. 09/927,648, filed on Aug. 13, 2001, which are incorporated by reference in their entirety. This application also claims benefit of priority of provisional application Ser. No. 60/279,855 filed on Mar. 28, 2001, which is incorporated by reference in its entirety.

FIELD OF THE INVENTION

The present invention is directed generally to semiconductor devices and methods of fabrication and more particularly to a nonvolatile EEPROM memory device and method of fabrication.

BACKGROUND OF THE INVENTION

U.S. Pat. No. 5,768,192, issued to B. Eitan, and the technical article entitled "NROM: A Novel Localized Trapping, 2-Bit Nonvolatile Memory Cell" by B. Eitan et al. in *IEEE Electron Device Letters*, vol. 21, No. 11, November 2000, pp. 543-545 teach a nonvolatile semiconductor memory cell which uses asymmetrical charge trapping in the nitride charge storage layer of the Oxide-Nitride-Oxide (ONO) stack to store two bits in one cell. The cell is written by hot electron injection into the charge storage layer above the drain junction. The cell is read in the opposite direction to which it was written, i.e., voltages are applied to the source and gate, with the drain grounded. The memory cell is constructed in a p-type silicon substrate. However, this silicon-oxide-nitride-oxide-silicon (SONOS) 1TC memory requires LOCOS (localized oxidation of silicon) isolation regions, which cause the cell area to be larger than desirable, and leads to a less than optimum cell density and increases the number of photolithographic masking steps.

Another type of prior art memory device is disclosed in the technical article entitled "A Novel Cell Structure for Giga-bit EPROMs and Flash Memories Using Polysilicon Thin Film Transistors" by S. Koyama in 1992 *Symposium on VLSI Technology Digest of Technical Papers*, pp. 44-45. As shown in FIG. 1, each memory cell is a "self-aligned" floating gate cell and contains a polycrystalline silicon thin film transistor electrically erasable programmable read only memory (TFT EEPROM) over an insulating layer. In this device, the bit lines extend in the direction parallel to the source-channel-drain direction (i.e., the bit lines extend parallel to the charge carrier flow direction). The word lines extend in the direction perpendicular to the source-channel-drain direction (i.e., the word lines extend perpendicular to the charge carrier flow direction). The TFT EEPROMs do not contain a separate control gate. Instead, the word line acts as a control gate in regions where it overlies the floating gates.

The layout of Koyama requires two polycide contact pads to be formed to contact the source and drain regions of each TFT. The bit lines are formed above the word lines and contact the contact pads through contact vias in an interlayer insulating layer which separates the bits lines from the word lines. Therefore, each cell in this layout is not fully aligned, because the contact pads and the contact vias are each patterned using a non-self-aligned photolithography step. Therefore, each memory cell has an area that is larger than desirable, and leads to a less than optimum cell density. The memory cell of Koyama is also complex to fabricate because it requires the formation of contact pads and bit line contact vias, which requires separate photolithographic masking steps. Furthermore, the manufacturability of the device of Koyama is less than optimum because both bit lines and word lines have a non-planar top surface due to the non-planar underlying topography. This may lead to open circuits in the bit and word lines.

BRIEF SUMMARY OF THE INVENTION

A preferred embodiment of the present invention provides a floating gate transistor, comprising a channel island region, a source region located adjacent to a first side of the channel island region, a drain region located adjacent to a second side of the channel island region, a tunneling dielectric located above the channel island region and a floating gate having a first, second, third and fourth side surfaces, wherein the floating gate is located above the tunneling dielectric. The transistor also comprises a control gate dielectric located above the floating gate and a control gate located above the control gate dielectric. The first and second side surfaces of the control gate are aligned to third and fourth side surfaces of the channel island region, and to third and the fourth side surfaces of the floating gate.

Another preferred embodiment of the present invention provides a method of making a floating gate transistor, comprising providing a semiconductor active area, forming a tunnel dielectric layer over the active area, forming a floating gate layer over the tunnel dielectric layer, forming a first photoresist mask over the floating gate layer, patterning the floating gate layer using the first photoresist mask to form a floating gate rail and doping the active area using the floating gate rail as a mask to form source and drain regions in the active area. The method further comprises forming an intergate insulating layer adjacent to lower portions of side surfaces of the floating gate rail, forming a control gate dielectric layer over and adjacent to upper portions of the side surfaces of the floating gate rail, forming a control gate layer over the control gate dielectric layer, forming a second photoresist mask over the control gate layer, and patterning the control gate layer, the control gate dielectric layer, the floating gate rail, the tunnel dielectric layer and the active area using the second photoresist mask to form a control gate, a control gate dielectric, a floating gate, a tunnel dielectric and a channel island region.

Another preferred embodiment of the present invention provides a method of forming an array of floating gate transistors, comprising forming at least portions of a plurality of floating gates over a tunnel dielectric located over a semiconductor active area, doping the active area using the at least portions of the plurality of floating gates as a mask to form a plurality of bit lines in the active area and forming an intergate insulating layer between lower portions of side surfaces of the at least portions of the plurality of floating gates. The method further comprises forming a control gate dielectric on exposed upper surfaces of the at least portions of the floating gates and on exposed upper portions of side surfaces of the at least portions of the floating gates, and forming a plurality of word lines over the control dielectric and over the intergate insulating layer.

Another preferred embodiment of the present invention provides method of making a floating gate transistor, comprising forming the entire floating gate transistor using two photolithographic masking steps.

DETAILED DESCRIPTION OF THE PREFERRED EMBODIMENTS

The present inventors have realized that memory cell area is enlarged by misalignment tolerances that are put into place to guarantee complete overlap between features on different layers. Thus, the present inventors have developed a fully aligned memory cell structure which does not require misalignment tolerances. Therefore, such a cell structure has a smaller area per bit (i.e., per cell) and uses fewer mask steps. The fully aligned cell structure increases memory density and decreases die size and cost. Furthermore, by optionally stacking the cells vertically in the Z-direction, the memory density is further increased, which leads to further decreases in the die size and cost.

As described with respect to the preferred embodiments of the present invention, an entire floating gate EEPROM transistor may be made using only two photolithographic masking steps. This decreases the process cost and complexity and ensures the precise alignment or self-alignment of the layers of the transistor, since many of these layers are patterned together using the same photoresist mask.

For example, by patterning the control and floating gates using the same mask as the channel results in a channel island which has at least two side surfaces which are aligned to the floating and control gates. Furthermore, forming channel regions as islands and then filling the trenches between the islands with an insulating layer creates trench isolation between adjacent transistors without requiring an extra photolithographic masking step. In contrast, an extra photolithographic masking step is required to form prior art LOCOS or trench isolation between transistors.

Figure 1:
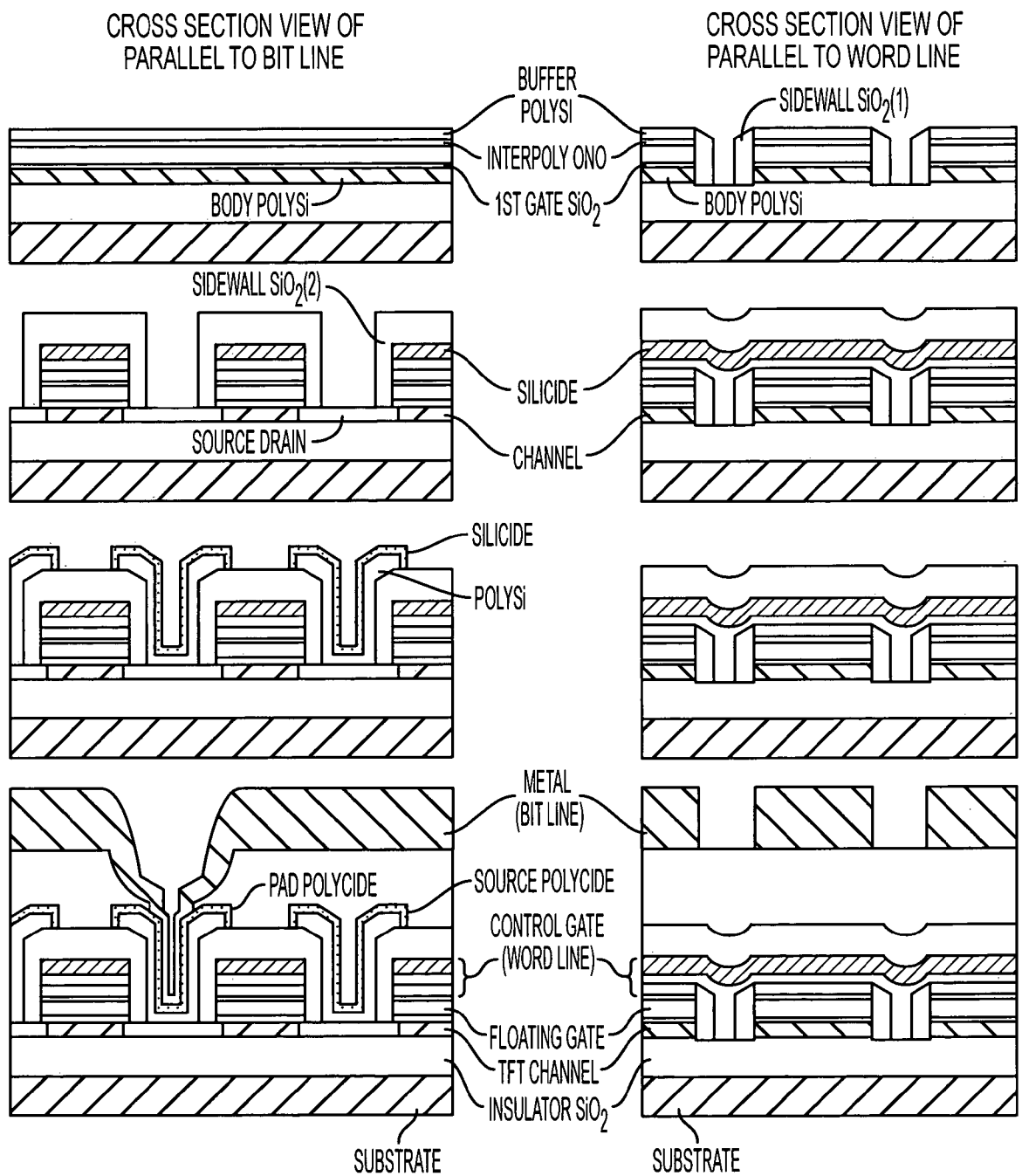
FIG. 1 is diagram of the process flow of a method of making a prior art memory device.

Furthermore, the separate photolithographic masking step to form bit lines of the prior art process of FIG. 1 may be eliminated by forming the bit lines using the same masking step used to form the floating gates. For example, the floating gate layer is patterned only in one direction to form floating gate rails or strips. Then, the semiconductor active region portions exposed between the floating gate rails is implanted and/or silicided to form conductive rails or strips extending parallel to the floating gate rails. These conductive rails in the active region act as the bit lines. These bit lines are then covered by an intergate insulating layer which is formed in self-alignment between the floating gate rails. The floating gate rails are then patterned to form discrete floating gates using the same mask as is used to form the channel regions and the control gate. Since the intergate insulating layer covers the bit lines during this etching step, the bit lines are not etched during the channel etching step. The portions of the bit lines adjacent to the patterned floating gates act as the source and drain of a given EEPROM transistor.

In this configuration, bit line contact pads (i.e., source and drain electrodes) and bit line contact vias are not required because the bit lines may be formed in self-alignment with the EEPROM floating gates. Furthermore, since the EEPROMs are fully aligned or self-aligned, the bit and word lines may have a substantially planar upper surface, which improves the reliability of the device.

The method of making the array of EEPROM transistors 1 according to the first preferred embodiment of the present invention will now be described in detail with references to FIGS. 2-10. It should be noted that the present invention is not limited to an array of transistors, and includes the formation of a single transistor. It should also be noted that the array 1 does not have to be formed in a silicon layer located on an insulating surface (i.e., does not have to be formed as a TFT array), and may instead be formed in a bulk silicon substrate to form a bulk MOSFET EEPROM array.

Figure 2:
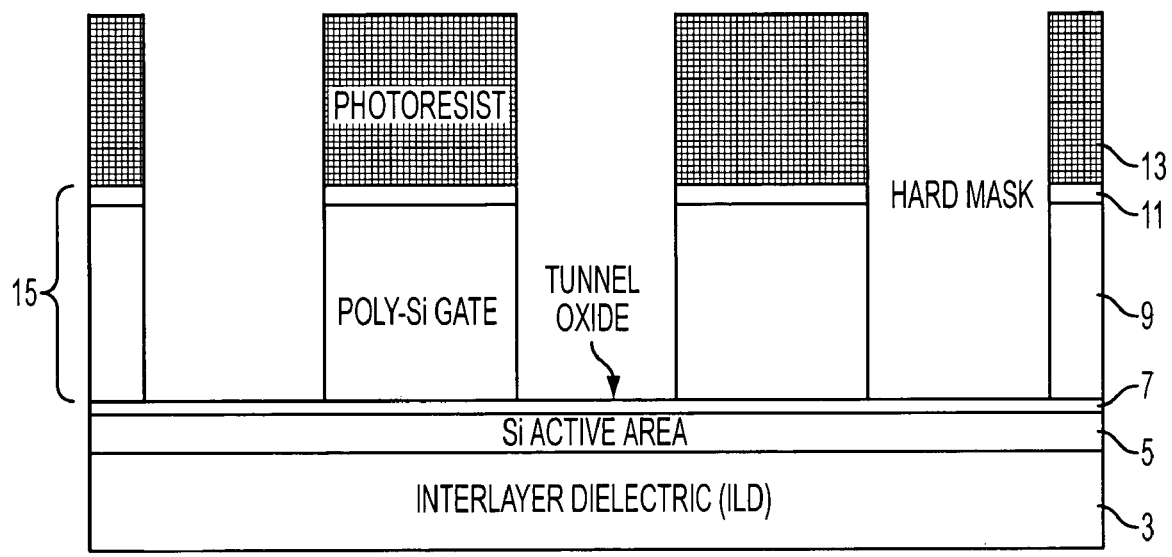
FIG. 2 is a side cross-sectional view of an in process memory array after the formation of the floating gate rails according to the first preferred embodiment of the present invention.

A substrate having an insulating surface (i.e., a Silicon-On-Insulator (SOI) substrate) is provided for the formation of the memory array. The substrate may comprise a semiconductor (i.e., silicon, GaAs, etc.) wafer covered with an insulating layer, such as a silicon oxide or nitride layer, a glass substrate, a plastic substrate, or a ceramic substrate. In a preferred aspect of the first embodiment, the substrate is a monocrystalline bulk silicon substrate that has received prior processing steps, such as forming CMOS (complementary metal oxide semiconductor) transistors in the substrate. The CMOS transistors may comprise peripheral or driver circuitry for the memory array. In the most preferred aspect, the circuitry comprises row and column address decoders, column input/outputs (I/O's), and other logic circuitry. However, if desired, the driver circuitry may be formed on an insulating substrate, such as a silicon-on-insulator substrate, a glass substrate, a plastic substrate, or a ceramic substrate. The silicon-on-insulator substrate may be formed by any conventional method, such as wafer bonding, Separation by Implantation of Oxygen (SIMOX), and formation of an insulating layer on a silicon substrate. After the peripheral circuitry is completed, an interlayer insulating layer (also known as an interlayer dielectric) 3 is conformally deposited over the circuitry as shown in FIG. 2. The interlayer insulating layer 3 may comprise one or more of any suitable insulating layers, such as silicon oxide, silicon nitride, silicon oxynitride, PSG, BPSG, BSG, spin-on glass and/or a polymer dielectric layer (such as polyimide, etc.). The interlayer insulating layer 3 is preferably planarized using chemical-mechanical polishing (CMP), etch back and/or any other means.

A semiconductor active area layer 5 is then deposited over the insulating layer 3 to complete the SOI substrate. The semiconductor layer will be used for the transistor active areas. Layer 5 may have any desired thickness, such as 10 to 120 nm, preferably less than 100 nm, most preferably less than 30 nm. Layer 5 is chosen so that in depletion regime the space charge region below the transistor gate extends over the entire layer. The layer 5 may be thinned to the desired thickness using wet silicon etching or by sacrificial oxidation following by a wet oxide etch. Preferably, the semiconductor layer 5 comprises an amorphous or polycrystalline silicon layer doped with first conductivity type dopants. For example, layer 5 may be p-type doped by in-situ doping during deposition, or after deposition by ion implantation or diffusion.

If desired, the crystallinity of the semiconductor layer 5 may be improved by heating the layer 5. In other words, an amorphous silicon layer may be recrystallized to form polysilicon or a grain size of a polysilicon layer may be increased. The heating may comprise thermal or laser annealing the layer 5. If desired, catalyst induced crystallization may be used to improve the crystallinity of layer 5. In this process, a catalyst element such as Ni, Ge, Mo, Co, Pt, Pd, a silicide thereof, or other transition metal elements, is placed in contact with the semiconductor layer 5. Then, the layer 5 is thermally and/or laser annealed. During the annealing, the catalyst element either propagates through the silicon layer leaving a trail of large grains, or serves as a seed where silicon crystallization begins. In the latter case, the amorphous silicon layer then crystallizes laterally from this seed by means of solid phase crystallization (SPC).

It should be noted that the deposition of amorphous or polysilicon layer 5 may be omitted if a single crystal SOI substrate is used. In this case, using the SIMOX method, oxygen ions are implanted deep into a single crystal silicon substrate, forming a buried silicon oxide layer therein. A single crystal silicon layer remains above the buried silicon oxide layer.

Next, the surface of the active area layer 5 is preferably cleaned from impurities and a native oxide is removed. A tunnel dielectric 7 is formed on the active area layer 5. Preferably, the tunnel dielectric comprises a thermally grown silicon oxide layer (i.e., a silicon dioxide layer grown on the silicon layer 5 by exposing layer 5 to an oxygen containing atmosphere to convert a top portion of layer 5 to silicon dioxide). The tunnel dielectric has a thickness of 5 nm to 10 nm, preferably 7 nm. It should be noted that different layer thicknesses and different materials, such as silicon nitride or silicon oxynitride, may be used instead.

After the tunnel dielectric 7 is formed, a floating gate layer 9 is deposited over, and preferably directly on the tunnel dielectric 7. The floating gate layer 9 preferably comprises a polysilicon layer, such as an N+ polysilicon layer. Such a polysilicon layer may have any appropriate thickness, such as 100 to 300 nm, preferably 200 nm, and any appropriate dopant concentration, such as $10^{19}$-$10^{21}$ cm$^{-3}$, preferably $10^{20}$ cm$^{-3}$.

If desired, an optional hardmask or etch stop layer 11, such as a silicon oxide layer or a dual lower silicon oxide/upper silicon nitride film, is formed on the surface of the floating gate layer 9. Layer 11 may have any appropriate thickness, such as, for example 20-200 nm, preferably 50 nm. Materials other than silicon oxide and silicon nitride may be used for layer 11, if desired.

Next, a bit line pattern is transferred to the in process array using a reverse bit line mask, as shown in FIG. 2. For example, a positive photoresist layer 13 is formed over the hardmask layer 11 and then exposed through the reverse bit line mask and developed. Of course, if a negative photoresist is used, then the clear and the opaque areas of the bit line mask are reversed.

The photoresist mask 13 features are etched into the hardmask layer 11, and the floating gate layer 9, to form a plurality of rail stacks 15, as shown in FIG. 2. The tunnel dielectric 7 serves as an etch stop layer. Then, the photoresist mask 13 is stripped from the patterned gate rail stacks 15.

Figure 3:
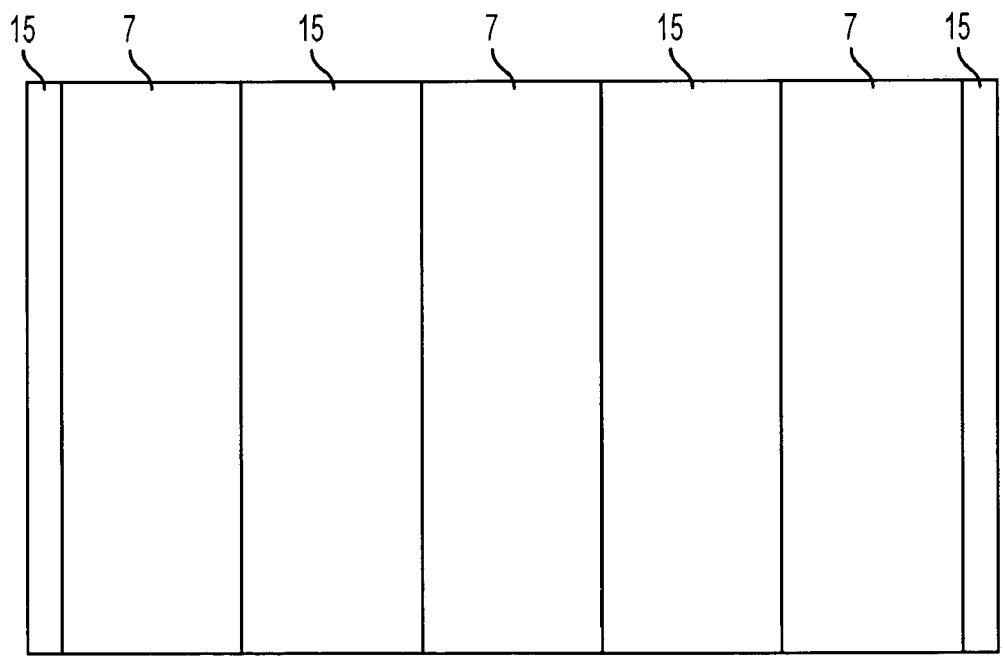
FIG. 3 is a top view of FIG. 2.

FIG. 3 illustrates the top view of the in process array shown in FIG. 2. As shown in FIG. 3, the rail stacks 15 are in the shape of strips, and contain the floating gate rails 9 and the hardmask rails 11. The tunnel dielectric 7 is exposed in the areas between the rail stacks 15. If desired, an optional thin layer of silicon nitride, oxynitiride or oxide is grown to seal the exposed sidewalls of the floating gate rails 9.

Figure 4:
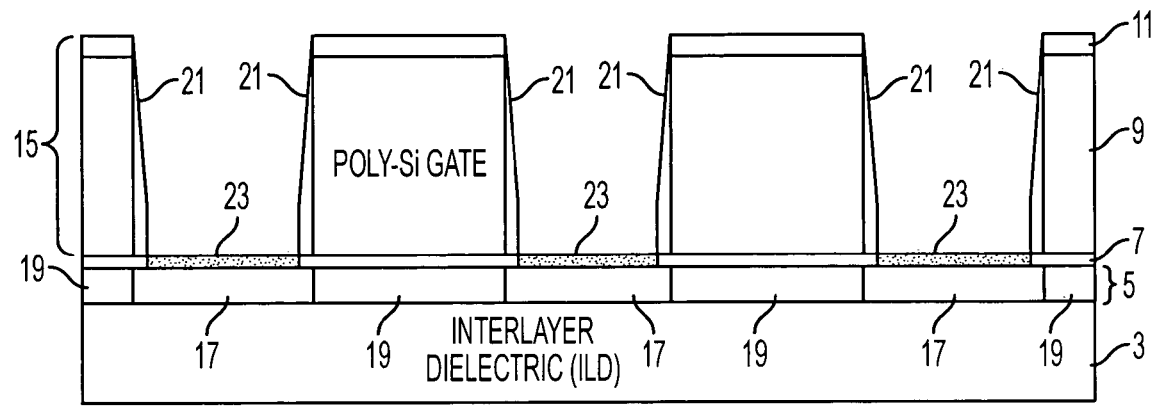
FIG. 4 is a side cross-sectional view of an in process memory array after floating gate rail patterning and bit line implantation and silicidation according to the first preferred embodiment of the present invention. The cross-section is perpendicular to the bit lines.

The array bit lines 17 are formed by self-aligned ion implantation into the active layer 5, using the rail stacks 15 as a mask, as shown in FIG. 4. The photoresist layer 13 is removed prior to the implantation. Alternatively, it may be left on the rail stacks 15 during this implantation. The ion implantation is carried out through the tunnel dielectric 7. However, if desired, the portions of the tunnel dielectric 7 between the floating gate rails 9 may be removed prior to the ion implantation.

Channel regions 19 in the active layer 5 are located below the floating gate rails 9. The bit lines 17 are doped with a second conductivity type dopant different from the first conductivity type dopant of the channels 19. Thus, if the channels 19 are p-type doped, then the bit lines 17 are n-type doped, and vice-versa.

Next, optional sidewall spacers 21 are formed on the sidewalls of the rail stacks 15, as shown in FIG. 4. Preferably, the spacers 21 comprise silicon oxide or silicon nitride. Most preferably, the spacers comprise a different material from the hardmask layer. The spacers 21 are preferably formed by conformal deposition of a silicon oxide layer over the stacks 15, followed by an anisotropic oxide etch. The spacer etch process concludes with an etch process for the tunnel dielectric 7 to expose the bit lines 17. Doping in the bit lines 17 may be increased at this time by additional self-aligned ion implantation, using the rail stacks 15 and spacers 21 as a mask, if desired. In this case, the implantation before spacer formation is used to form lightly doped portions or extensions of the source/drain (LDD) portions (about $1\times10^{16}$ to about $1\times10^{18}$ cm$^{-3}$ doping concentration) while the doping after spacer formation is used to form heavily doped source and drain regions (about $1\times10^{19}$ to about $1\times10^{21}$ cm$^{-3}$ doping concentration). Preferably, the bit lines a n-type doped. However, p-type doping may be used instead. The formation of the spacers 21 and the lightly doped extensions may be omitted if desired.

The salicide process is then used to form silicide regions 23 in the top of the bit lines 17 in a self-aligned fashion, as shown in FIG. 4. The salicide process comprises three steps. First a layer of metal, such as Ti, W, Mo, Ta, etc., or a transition metal such as Co, Ni, Pt or Pd is blanket deposited over the exposed bit line regions 17, the sidewall spacers 21 and the hardmask layer 11 of the rail stacks 15. The array is annealed to perform a silicidation by direct metallurgical reaction, where the metal layer reacts with the silicon in regions 17 to form the silicide regions 23 over regions 17. The unreacted metal remaining on the spacers 21 and the hardmask layer 11 is removed by a selective etch, e.g., by a piranha solution. The silicide regions 23 comprise portions of the bit lines 17 in addition to the previously doped silicon regions in the active layer 5.

Figure 5:
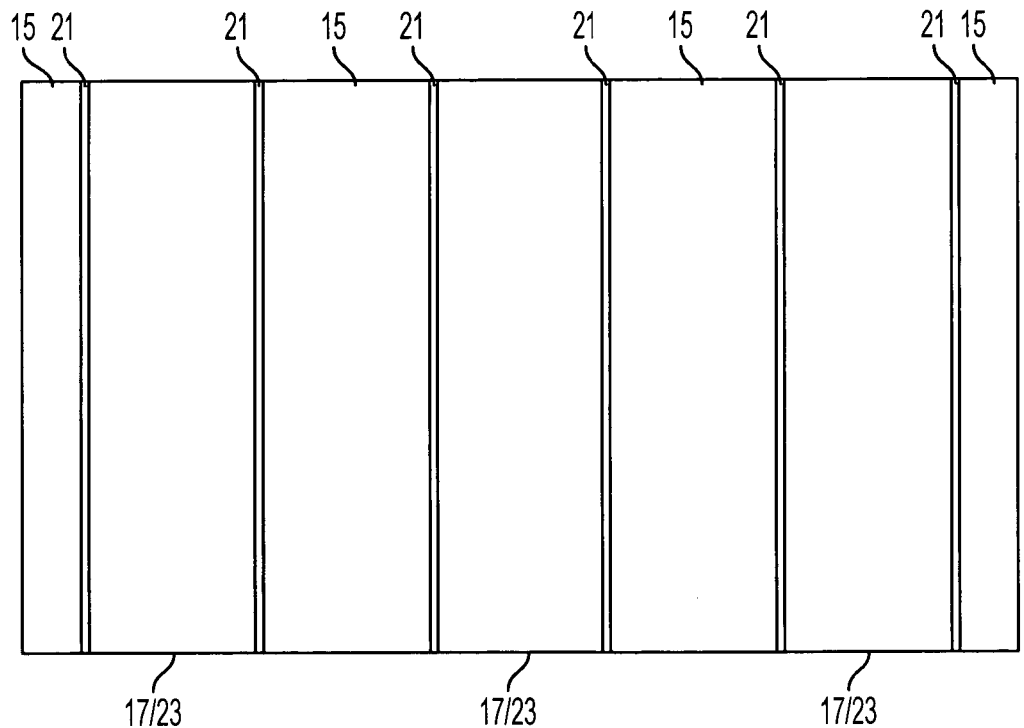
FIG. 5 is a top view of FIG. 4.

FIG. 5 shows the top view of the device in FIG. 4 at this stage in the processing. The bit lines 17 containing silicide regions 23 extend as strips parallel to the rail stacks 15.

Figure 6:
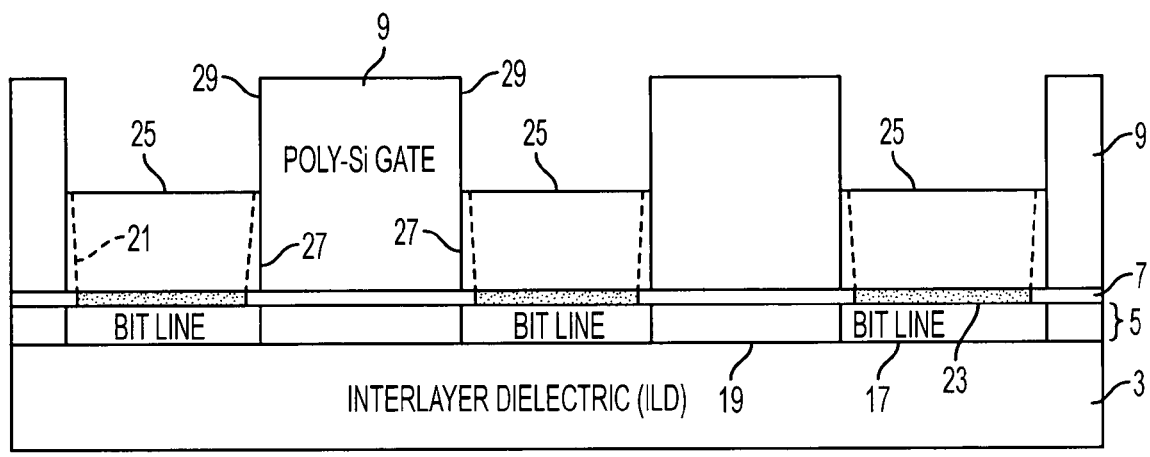
FIG. 6 is a side cross-sectional view of an in process memory array after the formation of the intergate insulating layer according to the first preferred embodiment of the present invention. The cross-section is perpendicular to the bit lines.

A conformal intergate insulating layer 25 is then deposited to fill the trenches above the bit lines 17 and between the floating gate rails 15 and sidewall spacers, as shown in FIG. 6 (the sidewall spacers 21 are merged into layer 25 in FIG. 6). The insulating layer 25 may comprise any insulating material, such as silicon oxide, silicon oxynitride, phosphosilicate glass (PSG), borophosphosilicate glass (BPSG), borosilicate glass (BSG), spin-on glass, a polymer dielectric layer (such as polyimide, etc.), and/or any other desired insulating material. Preferably, the intergate insulating layer is an isolation silicon oxide layer deposited by a high density plasma (HDP) method.

The intergate insulating layer 25 is formed over and between the rail stacks 15 (i.e., over and adjacent to the floating gate rails 9). The intergate insulating layer 25 is then etched back such that the intergate insulating layer 25 remains adjacent to lower portions 27 of the floating gate rail side surfaces, below top portions 29 of the floating gate rail side surfaces. Thus, the top portions 29 of the side surfaces of the floating gate rails 9 are exposed during this etchback. Furthermore, the top portions of the sidewall spacers 21 and the hardmask layer 11 are removed from the floating gate rails 9 during the etchback, as shown in FIG. 6.

Figure 7:
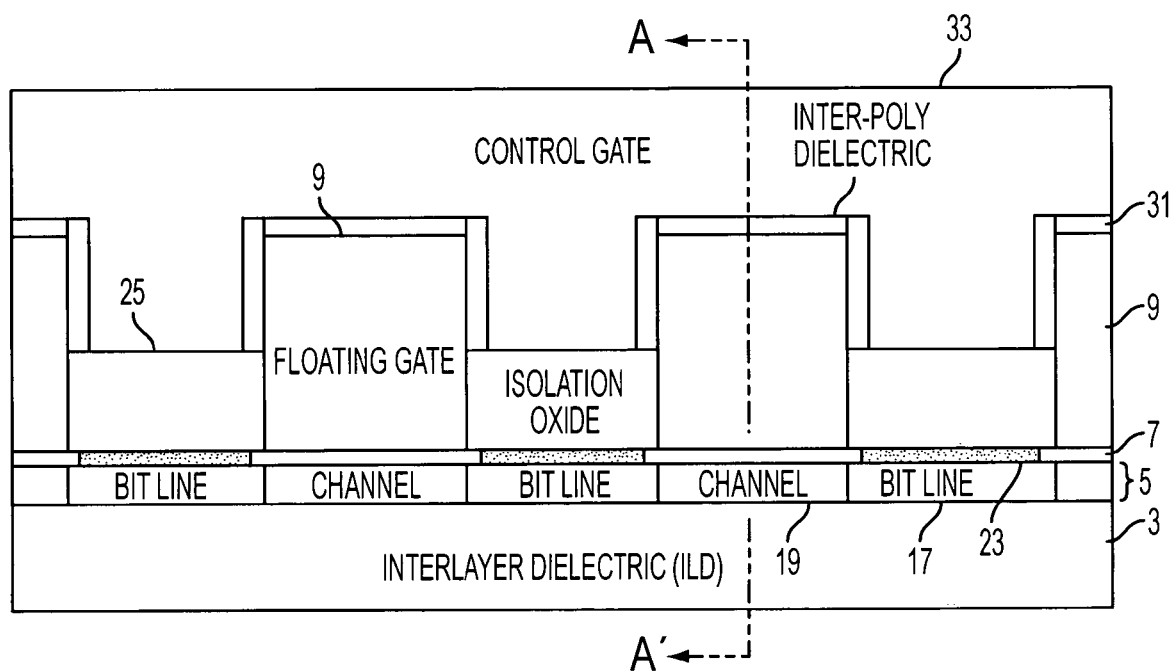
FIG. 7 is a side cross-sectional view of the array after the formation of the control gate layer according to the first preferred embodiment of the present invention. The cross-section is perpendicular to the bit lines.

A control gate dielectric layer 31 (also known as an interpoly dielectric) is formed over the floating gate rails 9, as shown in FIG. 7. The control gate dielectric layer 31 is formed on the upper portions 29 of the side surfaces of the floating gate rail 9 and on the top surface of the floating gate rail 9. The control gate dielectric layer 31 may have any appropriate thickness, such as 8 to 20 nm, preferably 12 nm of silicon oxide equivalent. The control gate dielectric may comprise several dielectric materials with varying dielectric permittivities. The silicon oxide equivalent is silicon oxide of such thickness that when used as a dielectric in a capacitor, it yields the same capacitance per unit area as the control gate dielectric. The control gate dielectric layer 31 may be grown on the control gate by thermal oxidation or deposited by CVD or other means. The control gate dielectric may comprise silicon oxide, silicon nitride, silicon oxynitride, or a stack comprising a thermally grown silicon oxide layer, a LPCVD deposited silicon nitride layer and a high temperature LPCVD deposited silicon oxide (HTO) layer.

If desired, the top surface and the upper portions 29 of the side surfaces of the floating gate rails 9 may be roughened prior to forming the control gate dielectric layer. The roughening may be accomplished by etching the exposed polysilicon of the rails 9 with an etching medium which selectively attacks polysilicon grain boundaries, such as wet etching with $NH_3OH$.

The control gate layer 33 is then deposited over the entire device, as shown in FIG. 7. The control gate layer 33 is formed on the control gate dielectric layer 31 such that the control gate layer 33 is located over the top surface of the floating gate rails 9 and laterally adjacent to the upper portions 29 of the side surfaces of the floating gate rails. Since the control gate is located adjacent to the top and sides of the floating gate, this increases the capacitance between the floating and control gates. Preferably, the control gate layer 33 comprises a multilayer stack comprising a first N+ polysilicon layer, a silicide layer (such as a TiSi or WSi, etc.) and a second N+ polysilicon layer. The polysilicon layers are preferably 100-300 nm thick, such as 200 nm thick. The silicide layer is preferably 50 to 100 nm thick, such as 60 nm thick. The lower polysilicon layer fills in the openings between the floating gates and overlies the control gate dielectric. Alternatively, the control gate layer can also be a single layer of silicide, metal, or any other combination of heavily doped amorphous or polycrystalline silicon, silicide, and/or metal.

Figure 8:
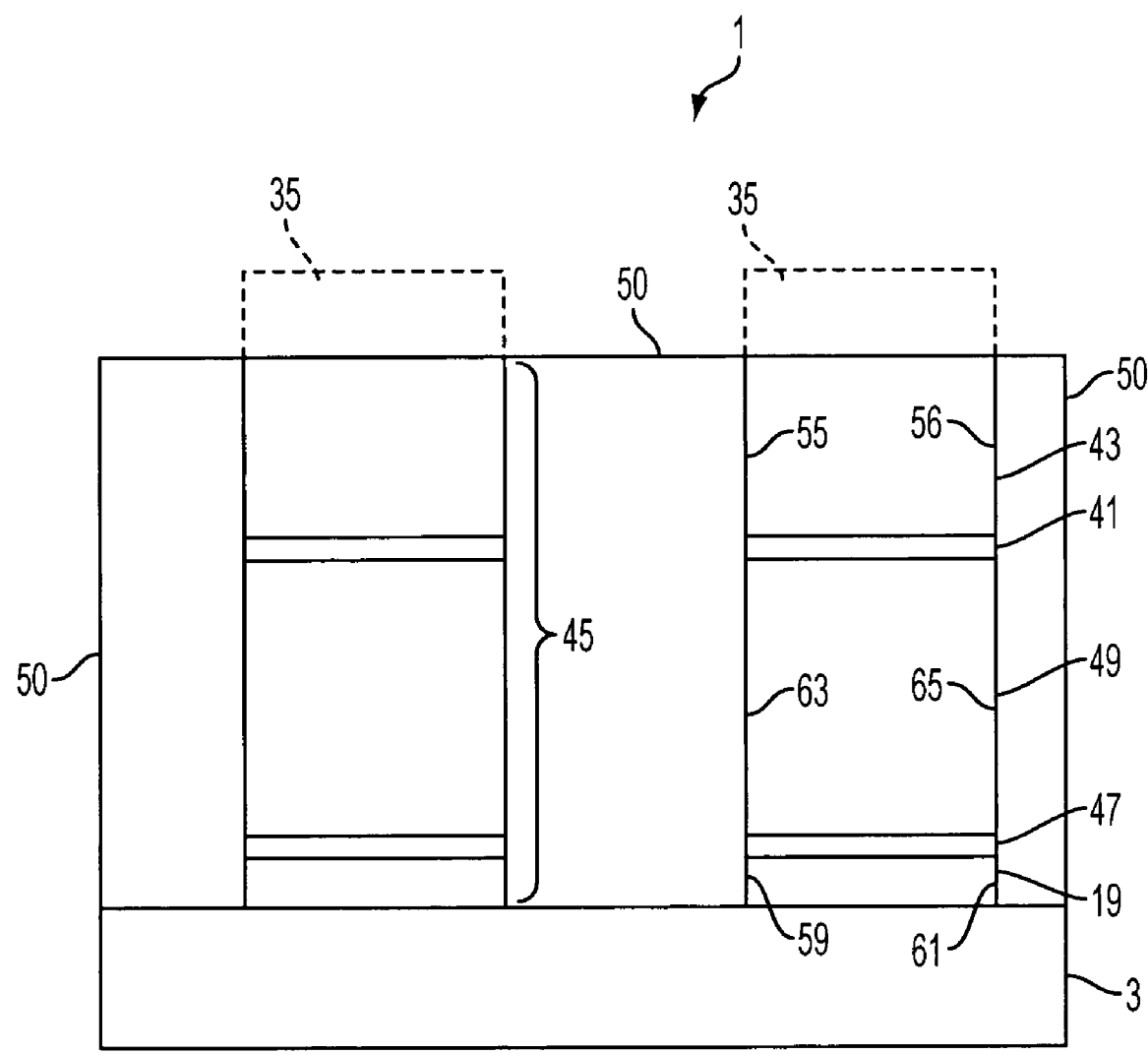
FIG. 8 is a side cross-sectional view of the array after the patterning of the control gate layer according to the first preferred embodiment of the present invention. The cross-section is taken along line A-A' in FIG. 7, and is parallel to the bit lines.

Next, a second photoresist mask 35 is formed by applying a photoresist layer over the control gate layer 33, exposing it through the word line mask and developing it. The second photoresist mask 35 is used as a mask to anisotropically etch the control gate layer 33, the control gate dielectric layer 31, the floating gate rails 9, the tunnel dielectric layer 7 and the active layer 5 to form a plurality of control gates 43, a plurality of control gate dielectrics 41, a plurality of floating gates 49, a plurality of tunnel dielectrics 47 and a plurality of channel island regions 19, as shown in FIG. 8. Photoresist mask 35 is shown in dashed lines to indicate that it has already been removed in the array of FIG. 8. FIG. 8 is a cross sectional view along line A-A' in FIG. 7.

Each control gate 43, control gate dielectric 41, floating gate 49, tunnel dielectric 47 and channel island region 19 comprise a second rail stack 45 as shown in FIG. 8. Thus, the sidewalls of the layers of the rail stacks 45 are aligned since the rail stacks 45 were formed during one etching step using the same mask 35.

If desired, the exposed sidewalls of the channel region islands 19, the floating gates 49 and the control gates 43 sidewalls may be optionally sealed by growing a thin layer of silicon nitride or oxide on them, for example by thermal nitridation or oxidation. This completes construction of the memory array 1. An insulating fill layer 50 is then deposited between the second rail stacks 45, and if necessary planarized by chemical mechanical polishing or etchback, over the control gates 43. Layer 50 acts as trench isolation fill between the adjacent channel island regions 19. Layer 50 preferably comprises the same material as the interlayer insulating layer 3.

Figure 9:
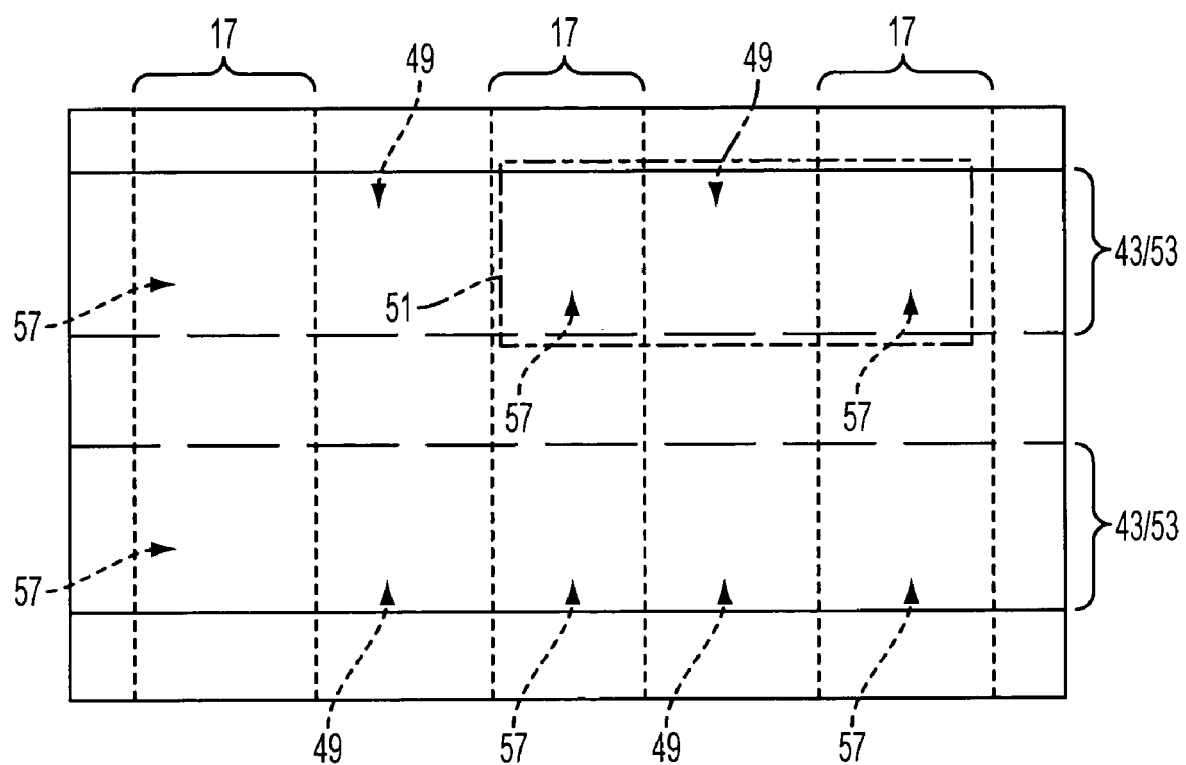
FIG. 9 is a top view of FIG. 8.
Figure 10:
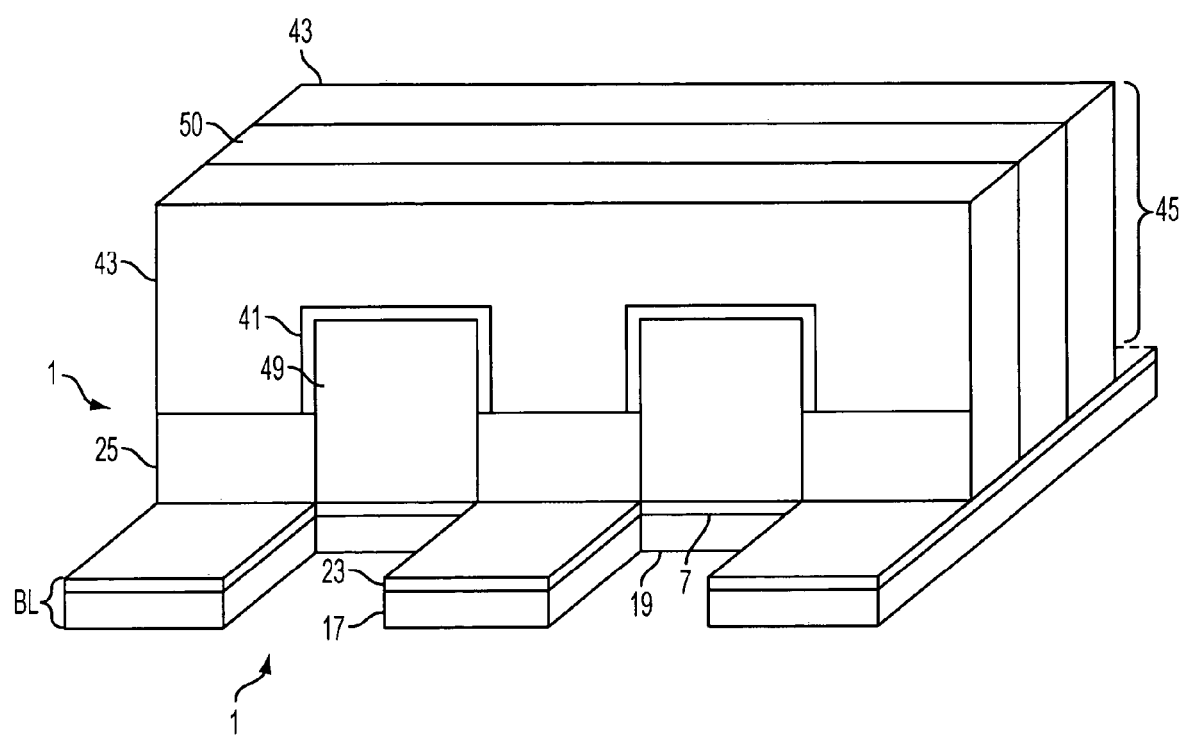
FIG. 10 is a three dimensional view of FIGS. 8 and 9.

FIG. 9 is a top view and FIG. 10 is a three dimensional view of memory array 1 after the second photoresist mask 35 is removed and layer 50 is formed. The array of EEPROMs shown in FIGS. 8-10 contains a plurality of bit line columns 17. Each bit line 17 contacts the source or the drain regions 57 of the TFT EEPROMs 51 (one exemplary memory cell or TFT EEPROM 51 is delineated by a dotted-dashed line in FIG. 9). The source and drain regions 57 are portions of the bit lines 17 that are located adjacent to the floating gates 49. Thus, the bit lines and the source and drain regions are formed in the same step without requiring an extra photolithographic masking step. The columns of bit lines 17 extend substantially perpendicular to the source-channel-drain direction of the TFT EEPROMs 51 (i.e., at least a portion of the bit lines extends 0-20 degrees from this perpendicular direction). The bit lines 17 comprise rails which are located under the intergate insulating layer 25.

It should be noted that in a memory array 1, the designations "source" and "drain" are arbitrary. Thus, the regions 57 may be considered to be "sources" or "drains" depending on which bit line 17 a voltage is provided. Furthermore, since no field oxide regions are preferably used in this memory array, each region 57 is located between two floating gates 49. Therefore, a particular region 57 may be considered to be a "source" with respect to one adjacent floating gate 49, and a "drain" with respect to the other adjacent floating gate 49. A source region 57 is located adjacent to a first side of the channel island region 19, while a drain region 57 located adjacent to a second side of the channel island region 19, such that the channel region is located between the source and drain regions 57. Furthermore, the term "rail" and "rail stack" are not limited to strips which extend in only one direction, and the "rails" and "rail stacks" may have curves or bends and extend in more than one direction.

The array 1 also contains a plurality of word lines 53 which contain the control gates 43. In other words, the control gate 43 of each transistor comprises a portion of a word line 53. The rows of word lines 53 extend substantially parallel to the source-channel-drain direction of the TFT EEPROMs 51 (i.e., at least a portion of the word lines extends 0-20 degrees from this parallel direction).

The floating gates 49 comprise posts located between the channel islands 19 and the control gates 43. The posts 49 have four side surfaces as shown in FIGS. 6, 7, 8 and 9. The first 55 and second 56 side surfaces of the control gate 43 are aligned to third 59 and fourth 61 side surfaces of the channel island region 19, and to third 63 and the fourth 65 side surfaces of the floating gate 49, as shown in FIG. 8. Furthermore, the first 55 and the second 56 side surfaces of the control gate 43 are aligned to side surfaces of the control gate dielectric 41 and to side surfaces of the tunneling dielectric 47, as shown in FIG. 8.

The word line photolithography step does not require misalignment tolerances, since the word lines 53 are patterned using the same mask as the floating gate rails 9 and the active layer 5 (i.e., channel regions 19) of each TFT 51 in the cell. Therefore, the word lines 53 are not only aligned to the floating gates 49 of the TFT EEPROMs 51 but are also aligned to the channel regions 19 of each memory cell. Furthermore, during the same etching step, the adjacent control gates, floating gates and channel islands are isolated from each other. By using a fully aligned memory cell, the number of expensive and time consuming photolithography steps are reduced. Furthermore, since no misalignment tolerances for each cell are required, the cell density is increased. Another advantage of the device of the first embodiment is that since a thick intergate insulating layer 25 is located between the bit lines 17 and the word lines 53, the parasitic capacitance and a chance of a short circuit between the bit lines and the word lines are decreased.

The nonvolatile memory array 1 may be programmed and erased by various conventional mechanisms. For example, the cells or TFT EEPROMs 51 of the array may be programmed or written by applying a programming voltage between the source and drain regions to achieve channel hot carrier (e.g., electron) injection into the floating gate 49. The cells or TFTs 51 of the array may be erased in blocks by applying an erase voltage between the control gate and a source or a drain to achieve Fowler-Nordheim carrier (i.e., electron) tunneling from the floating gate to the channel.

Figure 11:
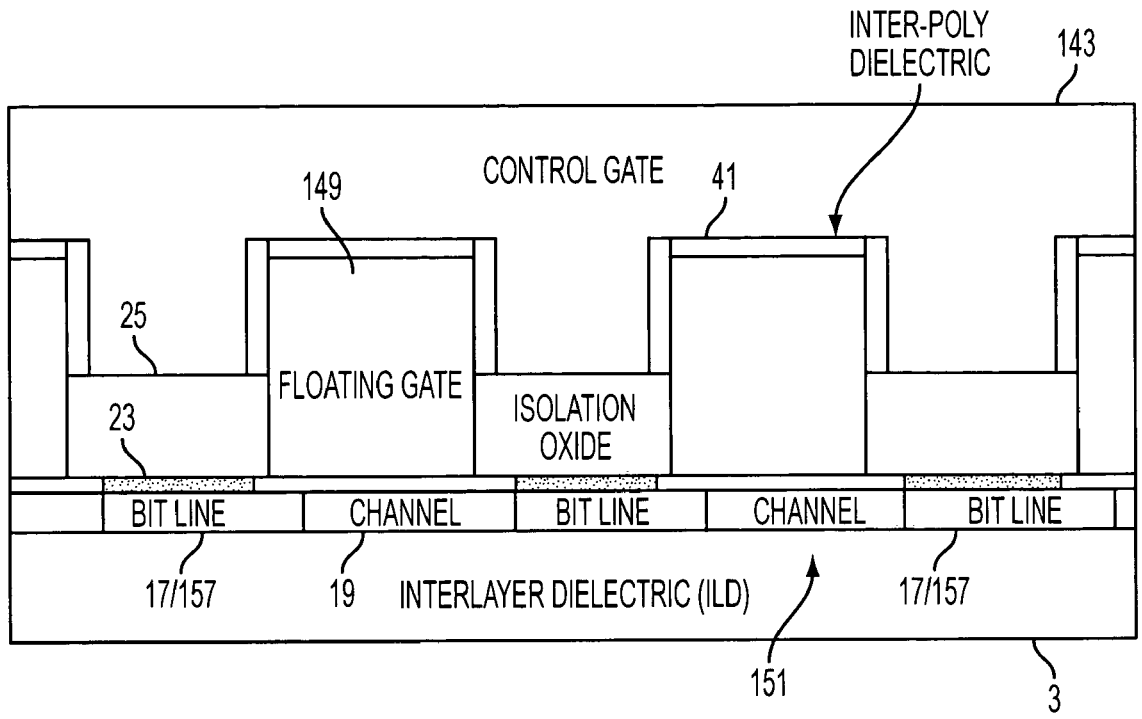
FIG. 11 is a side cross-sectional view of the array according to the second preferred embodiment of the present invention. The cross-section is perpendicular to the bit lines.

In a second preferred embodiment of the present invention, the array 100 contains cells or TFTs 151 which have asymmetric source and drain regions 157, as shown in FIG. 11. The drain overlap with the floating gate 149 is much larger than the source overlap with the floating gate 149. In FIG. 11, a region 157 that acts as a source for one floating gate 149 acts as a drain for an adjacent floating gate 149. The other features of the TFTs 151 are the same as those of TFTs 51 described in the first preferred embodiment.

Due to the floating gate 149 to drain 157 overlap, the array 100 may be programmed or written bitwise by Fowler-Nordheim tunneling from the floating gate 149 to the drain 157. The control gate 143 is grounded, while a programming voltage is applied to the asymmetric drain regions 157, while the source regions 157 float. Since the source region is offset from the floating gate, no tunneling occurs from the floating gate to the source. This programming step decreases the threshold voltage of the TFT 151.

The cells or TFTs 151 of the array 100 may be erased in blocks by applying a high erase voltage to the control gate and grounding the source and drain regions to achieve Fowler-Nordheim carrier (i.e., electron) tunneling from the channel to the floating gate. This programming increases the threshold voltage of the TFT 151.

Figure 12:
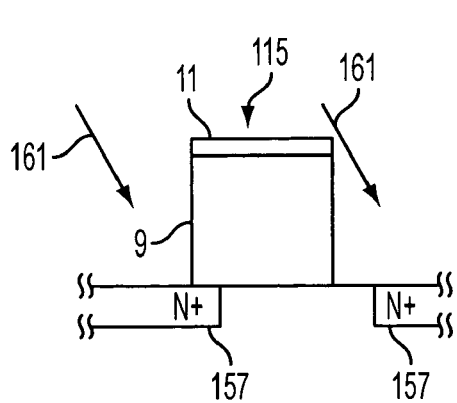
FIGS. 12-13 are schematic side cross-sectional views of angled ion implantation methods to form asymmetric source and drain regions of the second preferred embodiment of the present invention.
Figure 13:
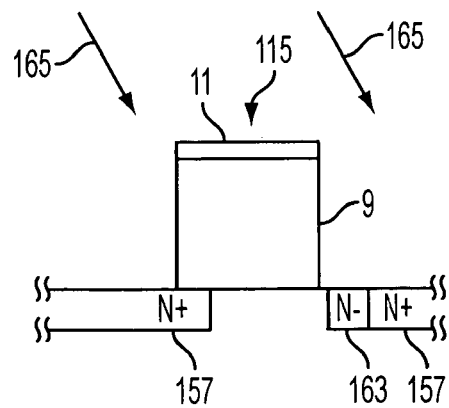

The asymmetric source and drain regions 157 may be formed by any desired method. For example, in one preferred method shown in FIG. 12, the source and drain regions 157 are formed by performing an angled ion implant 161 using the first rail stack 115 as a mask. In FIG. 12, the angled implant 161 comprises implanting heavily doped source and drain regions 157. If desired to form lightly doped portions of the source regions 163, then a lightly doped source region 163 is implanted at a smaller angle 165 sufficient to achieve an offset source as shown in FIG. 13.

The first and second preferred embodiments describe and illustrate a cross-point array of word lines and bit lines at a horizontal level and a method of making thereof. Each memory cell consists of a single programmable field effect transistor (i.e., TFT), with its source and drain connected to the $j^{th}$ bit line and the $(j+1)^{st}$ bit line, respectively, and a control gate being either connected to or comprising the $k^{th}$ word line. This memory arrangement is known as the NOR Virtual Ground (NVG) Array (also referred to as VGA). If desired, the memory array may also be arranged in non volatile flash memory architectures other than VGA, such as NOR-type memory or Dual String NOR (DuSNOR) memory, for example. The DuSNOR architecture, where two adjacent cell strings share a common source line but use different drain lines, is described in K. S. Kim, et al., IEDM-95, (1995) page 263, incorporated herein by reference. The DuSNOR memory may be fabricated using the same process as the VGA memory, except that an additional masking step is used to pattern the active area layer 5 to separate the drain regions of adjacent cells. The active area 5 is patterned using a third mask to form a plurality of islands containing two EEPROM transistors sharing a common source.

Alternatively, this additional masking step can instead be used to separate both drains and sources of adjacent cells, thus achieving full isolation of adjacent cell strings. The active area 5 is patterned using a third mask to form a plurality of islands containing one EEPROM transistor to form an array with separated drain and source lines. Thus, each cell does not share a source or a drain (i.e., bit) line with a laterally adjacent cell. This NOR-type memory array architecture is known as Separated Source Line NOR (SSL-NOR) memory. The SSL-NOR array architecture is described in I. Fujiwara, et al., Proceedings of Non-Volatile Semiconductor Memory Workshop (2000), page 117, incorporated herein by reference.

The process sequence of the first and second preferred embodiments of the present invention requires only two photolithographic masking steps to form each cell. One masking step is for gate patterning/self aligned bit line formation. The other masking step is for word line patterning. The methods of the preferred embodiments of the present invention exploit self-alignment to reduce alignment tolerances between the masks. The memory cell area achieved with the foregoing process is about 4 $f^2$, where f is the minimum feature size (i.e. 0.18 microns in a 0.18 micron semiconductor process). The term "about" allows for small deviations (10% or less) due to non-uniform process conditions and other small deviations from desired process parameters.

Figure 14:
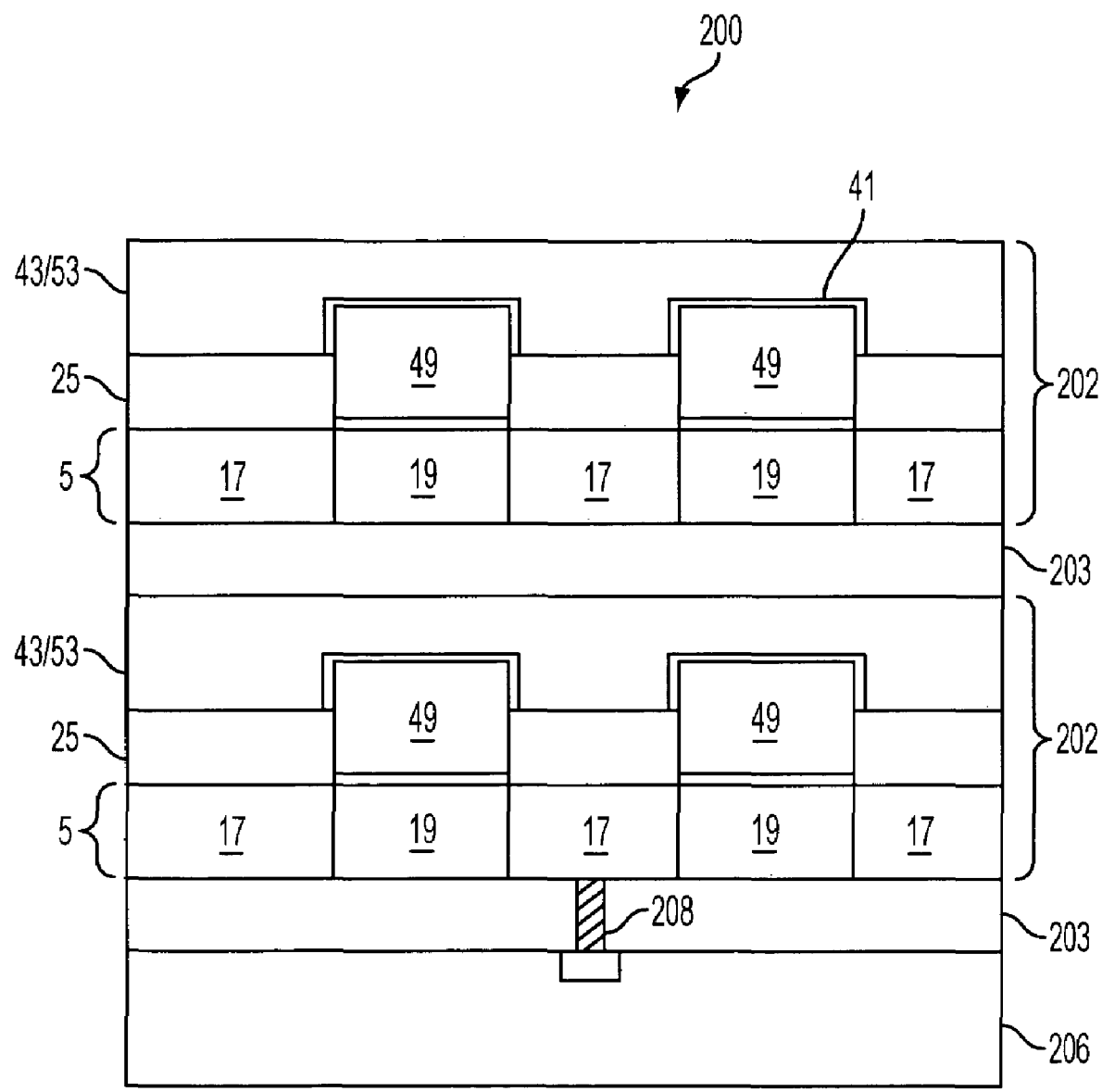
FIG. 14 is a schematic side cross-sectional view of a three dimensional array according to the third preferred embodiment of the present invention.

The array of the first and second preferred embodiments is very suitable for vertical stacking of horizontal planar arrays to form a three dimensional array of device levels, each device level containing an array TFT EEPROMs described above. FIG. 14 illustrates a three dimensional memory array 200 of the third preferred embodiment containing a plurality of device levels 202, the device levels containing the array 1 or 100 of TFT EEPROMs described above.

Each device level 202 of the array 200 is separated and decoupled in the vertical direction by an interlayer insulating layer 203. The interlayer insulating layer 203 also isolates adjacent word lines 53 and adjacent portions of the active areas 5 below the respective word lines in each device level 202. Connection between the bit lines, word lines and peripheral or driver circuits in the substrate 206 is made through vertical interlevel interconnects 208.

Figure 15:
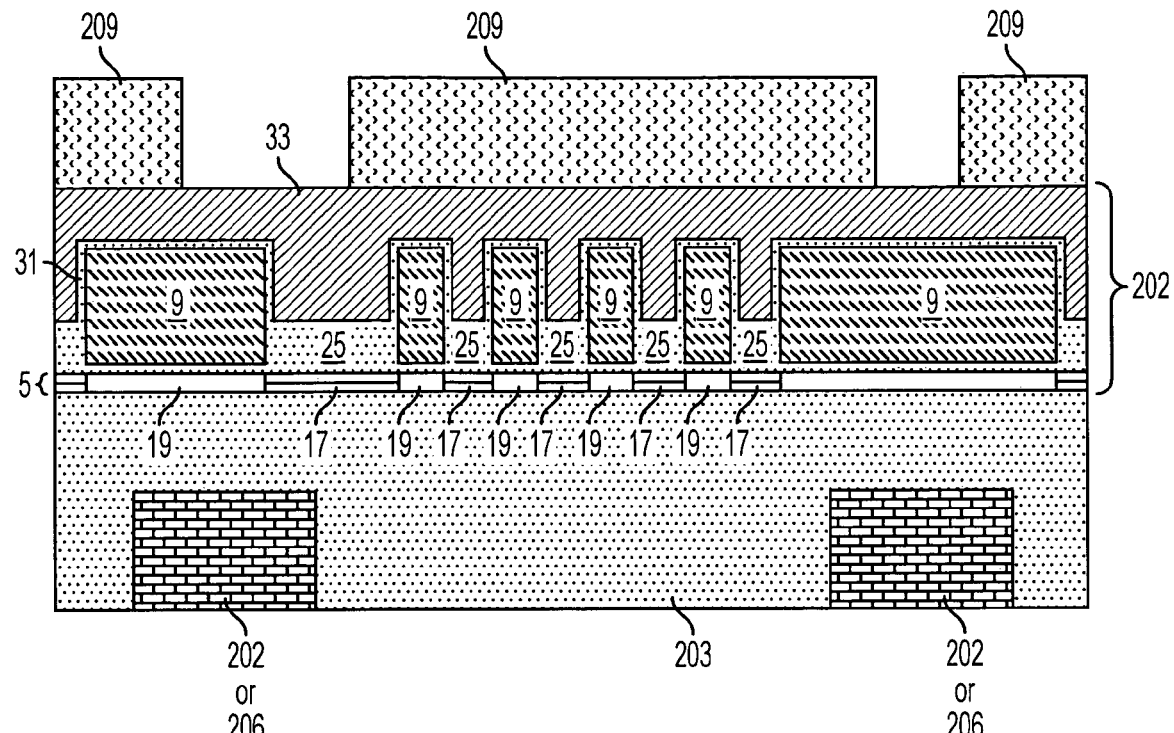
FIGS. 15-18 are schematic side cross-sectional views of formation of interconnects between device levels according to a fourth preferred embodiment of the present invention.
Figure 16:
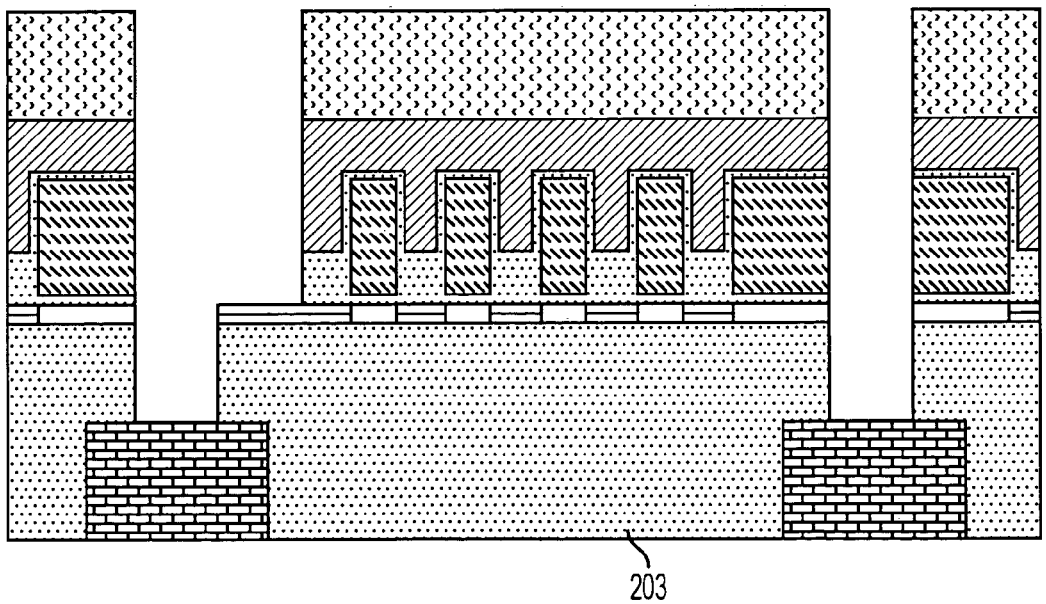
Figure 17:
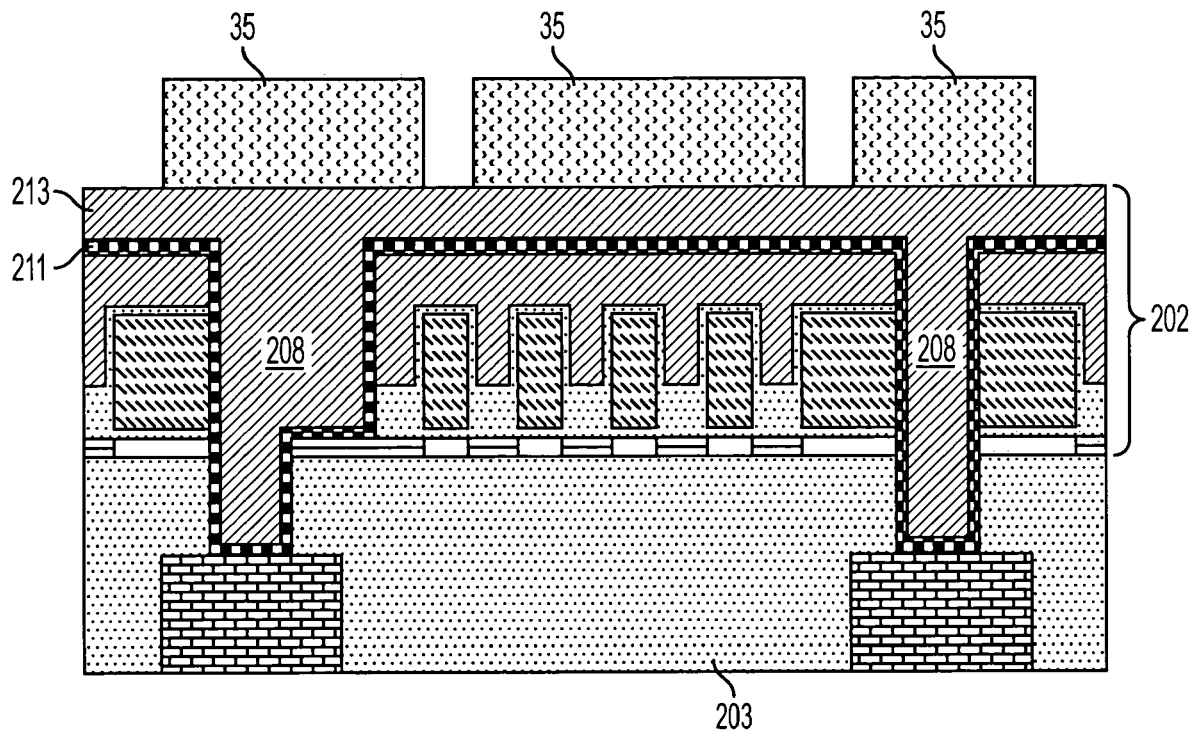
Figure 18:
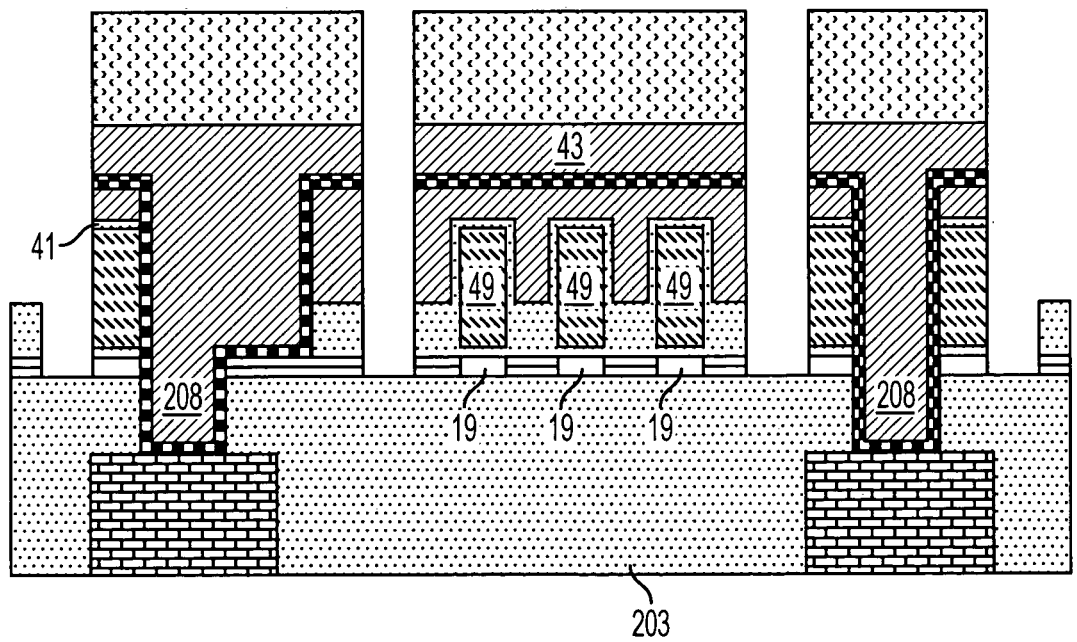

FIGS. 15 through 18 illustrate a method of forming vertical interlevel interconnects 208 between an upper device level 202 and a lower device level 202 or driver circuits in the substrate 206, according to a fourth preferred embodiment of the present invention. A photoresist mask 209 is formed by applying a photoresist layer over the first N+ polysilicon layer of the control gate layer 33, exposing the photoresist layer through an interlevel interconnect mask and developing the photoresist, as shown in FIG. 15. The photoresist mask 209 is used to anisotropically etch the first N+ polysilicon layer 33, the control gate dielectric layer 31, the floating gate rails 9, the tunnel dielectric layer 7, and the active layer 5, stopping the etch on the interlayer insulating layer 203 and the intergate insulating layer 25. Then, the insulating layers 203 and 25 are etched anisotropically using mask 209 to form at least one via extending to the lower device level 202 or substrate 206, as shown in FIG. 16. The use of the intergate insulating layer 25 as an etch stop allows the formation of a stepped via, as shown on the left side of FIG. 16. The photoresist mask 209 is subsequently removed. Next, a conducting layer 211, comprising a metal layer, such as Ti, W, etc., or a silicide layer, such as TiSi, WSi, etc., is deposited conformally on the first heavily doped N+ polysilicon layer 33, followed by conformal deposition of an optional second N+ polysilicon layer 213. Of course P+ polysilicon may be used instead of N+ polysilicon for these layers. Next, the wordline photoresist mask 35 is formed over layer 213, as shown in FIG. 17. Then, as shown in FIG. 18, the control gate etch process is performed similar to that shown in FIG. 8, to form the plurality of the control gates 43, the plurality of the floating gates 49, and the plurality of the channel island regions 19, as described above with respect to the first embodiment. The vertical interlevel interconnects 208 are formed, as shown in FIG. 18. The patterned conducting layer 211 and the second polysilicon layer 213 form the interconnects 208 as well as the upper portion of the control gates 43 (i.e., an upper portion of the word lines or gate lines 53). Thus, at least a portion of the word or gate line comprises the same layer(s) as the interlevel interconnects.

Preferably, the array of nonvolatile memory devices 200 comprises a monolithic three dimensional array of memory devices. The term "monolithic" means that layers of each level of the array 200 were directly deposited on the layers of each underlying level of the array. A first array or device level 202 of TFT EEPROMs is provided over the substrate 206. The interlayer insulating layer 203 is formed over this array. Then, at least one or more additional arrays or device levels 202 of TFT EEPROMs are monolithically formed on the interlayer insulating layer 203.

Alternatively, two dimensional arrays may be formed separately and then packaged together to form a non-monolithic three dimensional memory array 200. A plurality of arrays 1 or 100 of TFT EEPROMs are formed on different silicon-on-insulator substrates. The substrates are thinned by polishing or etching the back sides of the substrates. The arrays are then attached or glued to each other to form a three dimensional memory array 200.

Preferably, the TFTs in a plurality of the levels 202 of the three dimensional array 200 of FIG. 14 undergo a recrystallization and/or a dopant activation step at the same time. This reduces the device fabrication time and cost. Furthermore, if each level of the array is subjected to a separate crystallization and/or dopant activation annealing, then the lower levels would undergo more annealing steps than the upper levels. This may lead to device non uniformity because the grain size may be larger in the active areas of the lower levels and/or the source and drain regions may have a different dopant distribution in the lower levels than in the upper levels.

Each cell in one level 202 of the memory array 200 can be formed using only two photolithographic masking steps. However, additional masking steps may be needed to form contacts to the bit lines and the word lines. The preferred aspects of the present invention may also be applied to non-volatile flash memory architectures other than VGA, DuS-NOR and SSL-NOR memory. Furthermore, the present invention is not limited to TFT EEPROM flash memory arrays, and also encompasses other semiconductor devices within its scope. For example, the self-aligned transistors may be MOSFETs in a bulk substrate. These self-aligned transistors may be used as non-flash EEPROMs (i.e., EEPROMs where each transistor is erased separately), UV erasable PROMs (EPROMs), mask ROMs, dynamic random access memories (DRAMs), liquid crystal displays (LCDs), field programmable gate arrays (FPGA) and microprocessors.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. The drawings are not necessarily to scale and illustrate the memory array in schematic block format. It is intended that the scope of the invention be defined by the claims appended hereto, and their equivalents.

What is claimed is:

1. A method of making a floating gate transistor, comprising:

providing a semiconductor active area;

forming a tunnel dielectric layer over the active area;

forming a floating gate layer over the tunnel dielectric layer;

forming a first photoresist mask over the floating gate layer;

patterning the floating gate layer using the first photoresist mask to form a floating gate rail;

doping the active area using the floating gate rail as a mask to form source and drain regions in the active area;

forming an intergate insulating layer adjacent to lower portions of side surfaces of the floating gate rail;

forming a control gate dielectric layer over and adjacent to upper portions of the side surfaces of the floating gate rail;

forming a control gate layer over the control gate dielectric layer;

forming a second photoresist mask over the control gate layer; and patterning the control gate layer, the control gate dielectric layer, the floating gate rail, the tunnel dielectric layer and the active area using the second photoresist mask to form a control gate, a control gate dielectric, a floating gate, a tunnel dielectric and a channel island region.

2. The method of claim 1, comprising forming the entire floating gate transistor using two photolithographic masking steps.

3. The method of claim 1, wherein forming an intergate insulating layer adjacent to the side surfaces of the floating gate rail comprises:
   forming the intergate insulating layer over and adjacent to the floating gate rail; and
   etching back the intergate insulating layer such that the intergate insulating layer remains adjacent to the lower portions of the floating gate rail side surfaces below the upper portions of the floating gate rail side surfaces.

4. The method of claim 3, further comprising:
   forming a hardmask over the floating gate layer;
   forming the first photoresist mask on the hardmask layer; and
   patterning the hardmask layer and the floating gate layer using the first photoresist mask to form a first rail stack comprising a hardmask rail and the floating gate rail.

5. The method of claim 4, further comprising:
   implanting lightly doped portions of the source and drain regions using the first rail stack as a mask;
   forming sidewall spacers on the first rail stack;
   implanting heavily doped portions of the source and drain regions using the first rail stack and the sidewall spacers as a mask;
   forming a metal layer over the source and drain regions and over the first rail stack;
   annealing the first metal layer to react the metal layer with the source and drain regions to selectively form metal silicide regions on the source and drain regions; and
   selectively etching the unreacted metal layer remaining on the sidewall spacers and the first rail stack.

6. The method of claim 5, further comprising:
   selectively removing the hardmask and sidewall spacers from upper portions of the floating gate rail;
   forming the control gate dielectric layer on the upper portions of the side surfaces of the floating gate rail and on the top surface of the floating gate rail; and
   forming the control gate layer on the control gate dielectric layer such that the control gate layer is located over the top surface of the floating gate rail and laterally adjacent to the upper portions of the side surfaces of the floating gate rail.

7. The method of claim 4, further comprising roughening the top surface and the upper portions of the side surfaces of the floating gate rail prior to forming the control gate dielectric layer.

8. The method of claim 4, wherein forming the source and drain regions comprises performing an angled implant using the first rail stack as a mask to form source and drain regions which are asymmetric with respect to the first rail stack.

9. The method of claim 8, wherein the angled implant comprises implanting heavily doped source and drain regions.

10. The method of claim 9, further comprising implanting a lightly doped portion of the source region perpendicular to the active area.

11. The method of claim 1, further comprising:
   patterning the floating gate layer using the first photoresist mask to form a plurality of floating gate rails;
   doping the active area using the floating gate rails as a mask to form a plurality of source and drain regions in the active area;
   forming the intergate insulating layer between lower portions of the side surfaces of the floating gate rails;
   forming the control gate dielectric layer and the control gate layer over and adjacent to upper portions of the side surfaces of the floating gate rails;
   forming the second photoresist mask over the control gate layer; and
   patterning the control gate layer, the control gate dielectric layer, the floating gate rails, the tunnel dielectric layer and the active area using the second photoresist mask to form a plurality of control gates, a plurality of control gate dielectrics, a plurality of floating gates, a plurality of tunnel dielectrics and a plurality of channel island regions.

12. The method of claim 11, wherein the intergate insulating layer protects the plurality of source and drain regions in the active area during the patterning of the floating gate rails and the active area.

13. The method of claim 11, further comprising forming an insulating fill layer between adjacent second rail stacks, wherein each second rail stack comprises one of the plurality of control gates, one the plurality of control gate dielectrics, one of the plurality of floating gates, one of the plurality of tunnel dielectrics and one of the plurality of channel island regions.

14. The method of claim 11, wherein forming an intergate insulating layer adjacent to the side surfaces of the floating gate rail comprises:
   forming the intergate insulating layer over and adjacent to the floating gate rails; and
   etching back the intergate insulating layer such that the intergate insulating layer remains between the floating gate rails, adjacent to the lower portions of the floating gate rail side surfaces below the upper portions of the floating gate rail side surfaces.

15. The method of claim 14, further comprising patterning the hardmask layer and the floating gate layer using the first photoresist mask to form a plurality of first rail stacks each comprising a hardmask rail and the floating gate rail.

16. The method of claim 15, further comprising:
   implanting a plurality of lightly doped portions of the source and drain regions using the first rail stacks as a mask;
   forming sidewall spacers on the first rail stacks;
   implanting a plurality of heavily doped portions of the source and drain regions using the first rail stacks and the sidewall spacers as a mask;
   forming a metal layer over the plurality of source and drain regions and over the first rail stacks;
   annealing the first metal layer to react the metal layer with the plurality of source and drain regions to selectively form metal silicide regions on the plurality of source and drain regions; and
   selectively etching the unreacted metal layer remaining on the sidewall spacers and the first rail stacks.

17. The method of claim 16, further comprising:
   selectively removing the hardmask and sidewall spacers from upper portions of the floating gate rails;
   forming the control gate dielectric layer on the upper portions of the side surfaces of the floating gate rails and on the top surface of the floating gate rails; and
   forming the control gate layer on the control gate dielectric layer such that the control gate layer is located over the top surface of the floating gate rails and laterally adjacent to the upper portions of the side surfaces of the floating gate rails.

18. The method of claim 17, further comprising patterning the active area using a third mask to form a plurality of islands containing two EEPROM transistors sharing a common source to form a DuSNOR array.

19. The method of claim 17, further comprising patterning the active area using a third mask to form a plurality of islands containing one EEPROM transistor to form a SSL-NOR array with separated drain and source lines.

20. The method of claim 17, wherein:
the step of doping the active area further comprises forming a plurality of bit lines containing the plurality of source and drain regions, wherein the bit lines extend substantially perpendicular to a source-channel-drain direction;
the step of forming metal silicide regions comprises forming a metal silicide on the plurality of bit lines; and
the step of patterning the active area comprises etching the active area to form a plurality of channel island regions without etching the bit lines containing the source and drain regions which are covered by the intergate insulating layer.

21. The method of claim 1, wherein providing the semiconductor active area comprises forming a polysilicon active layer over an interlayer insulating layer.

22. The method of claim 21, wherein:
forming the tunnel dielectric layer over the active area comprises growing a thermal silicon oxide layer on the polysilicon active layer;
forming the floating gate layer over the tunnel dielectric layer comprises forming a polysilicon layer on the tunnel dielectric layer;
forming the first photoresist mask over the floating gate layer comprises forming the photoresist on a hardmask layer located on the floating gate layer;
patterning the floating gate layer using the first photoresist mask to form a floating gate rail comprises anisotropically etching the hardmask layer and the floating gate layer during one etching step using the first photoresist mask;
doping the active area using the floating gate rail as a mask to form source and drain regions in the active area comprises ion implanting the source and drain regions using the floating gate rail as a mask;
forming the intergate insulating layer adjacent to the side surfaces of the floating gate rail comprises forming the intergate insulating layer over and adjacent to the floating gate rail and etching back the intergate insulating layer such that the intergate insulating layer remains adjacent to the lower portions of the floating gate rail side surfaces below the upper portions of the floating gate rail side surfaces;
forming the control gate dielectric layer comprises growing a thermal silicon oxide layer on the floating gate rail, depositing a silicon nitride layer on the thermal silicon oxide layer and depositing a silicon oxide layer on the silicon nitride layer;
forming the control gate layer over the control gate dielectric layer comprises depositing a polysilicon layer and a silicide layer on the control gate dielectric layer;
forming the second photoresist mask over the control gate layer comprises forming the second photoresist mask on the control gate layer; and
patterning the control gate layer, the control gate dielectric layer, the floating gate rail, the tunnel dielectric layer and the active area using the second photoresist mask comprises anisotropically etching the control gate layer, the control gate dielectric layer, the floating gate rail, the tunnel dielectric layer and the active layer in one etching step to form second rail stacks.

23. The method of claim 11, further comprising:
forming an interlayer insulating layer below the active area;
forming at least one via extending through the interlayer insulating layer to a lower device level or to a driver circuit in a substrate;
depositing at least a portion of the control gate layer in the at least one via; and
patterning the control gate layer to form the plurality of control gates and an interlevel interconnect which connects the floating gate transistor with a device on a lower device level or with a driver circuit in the substrate.

24. The method of claim 23, further comprising:
forming a heavily doped polysilicon layer comprising a lower portion of the control gate layer;
forming the at least one via extending through the heavily doped polysilicon layer;
forming a conductive layer comprising an upper portion of the control gate layer on the heavily doped polysilicon layer and in the at least one via; and
patterning the heavily doped polysilicon layer and the conductive layer to form the plurality of control gates and the interlevel interconnect.

25. A method of forming a monolithic three dimensional memory array, comprising:
providing a first array of transistors of claim 11;
forming an interlayer insulating layer over the array; and
monolithically forming at least a second array of TFT EEPROMs on the interlayer insulating layer.

26. A method of forming a three dimensional memory array, comprising:
providing a plurality of arrays of transistors of claim 11 on different silicon on insulator substrates;
thinning the substrates; and
attaching the arrays to each other to form a three dimensional memory array.

27. A method of claim 8, further comprising:
programming the floating gate EEPROM transistor by Fowler-Nordheim electron tunneling from the floating gate to the drain region; and
erasing the floating gate EEPROM transistor by Fowler-Nordheim electron tunneling from the channel island region to the floating gate.

28. A method of forming an array of floating gate transistors, comprising:
forming at least portions of a plurality of floating gates over a tunnel dielectric located over a semiconductor active area;
wherein the step of forming the at least portions of the plurality of floating gates comprises:
providing the semiconductor active area;
forming a tunnel dielectric layer over the active area;
forming a floating gate layer over the tunnel dielectric layer;
forming a first photoresist mask over the floating gate layer and
patterning the floating gate layer using the first photoresist mask to form the plurality of the floating gate portions comprising floating gate rails;
doping the active area using the at least portions of the plurality of floating gates as a mask to form a plurality of bit lines in the active area;

wherein the step of doping the active area comprises:
doping the active area using the floating gate rails as a mask to form the plurality of bit lines containing transistor source and drain regions;
forming an intergate insulating layer between lower portions of side surfaces of the at least portions of the plurality of floating gates;
forming a control gate dielectric on exposed upper surfaces of the at least portions of the floating gates and on exposed upper portions of side surfaces of the at least portions of the floating gates; and
forming a plurality of word lines over the control dielectric and over the integrate insulating layer;
wherein the steps of forming the control gate dielectric and forming the plurality of word lines comprise:
forming a control gate dielectric layer and a control gate layer over and adjacent to upper portions of the side surfaces of the floating gate rails;
forming a second photoresist mask over the control gate layer; and
patterning the control gate layer, the control gate dielectric layer, the floating gate rails, the tunnel dielectric layer and the active area using the second photoresist mask to form the plurality of word lines containing transistor control gates, a plurality of control gate dielectrics, a plurality of floating gates, a plurality of tunnel dielectrics and a plurality of channel island regions.

29. The method of claim 28 wherein forming the intergate insulating layer comprises:
forming the intergate insulating layer over and adjacent to the floating gate rails; and
etching back the intergate insulating layer such that the intergate insulating layer remains between the floating gate rails, adjacent to the lower portions of the floating gate rail side surfaces below the upper portions of the floating gate rail side surfaces.

30. The method of claim 29, further comprising:
forming a hardmask layer over the floating gate layer; and
patterning the hardmask layer and the floating gate layer using the first photoresist mask to form a plurality of first rail stacks each comprising a hardmask rail and the floating gate rail.

31. The method of claim 30, further comprising forming an insulating fill layer between adjacent second rail stacks, wherein each second rail stack comprises one of the plurality of word lines, one the plurality of control gate dielectrics, one of the plurality of floating gates, one of the plurality of tunnel dielectrics and one of the plurality of channel island regions.

32. The method of claim 31, further comprising:
implanting a plurality of lightly doped portions of the source and drain regions using the first rail stacks as a mask;
forming sidewall spacers on the first rail stacks;
implanting a plurality of heavily doped portions of the source and drain regions using the first rail stacks and the sidewall spacers as a mask;
forming a metal layer over the plurality of bit lines, over the plurality of source and drain regions and over the first rail stacks;
annealing the first metal layer to react the metal layer with the plurality of bit lines and the plurality of source and drain regions to selectively form metal silicide regions on the plurality of bit lines and the plurality of source and drain regions; and
selectively etching the unreacted metal layer remaining on the sidewall spacers and the first rail stacks.

33. The method of claim 32, wherein:
providing the semiconductor active area comprises forming a polysilicon active layer over an interlayer insulating layer;
forming the tunnel dielectric layer over the active area comprises growing a thermal silicon oxide layer on the polysilicon active layer;
forming the floating gate layer over the tunnel dielectric layer comprises forming a polysilicon layer on the tunnel dielectric layer;
forming the first photoresist mask over the floating gate layer comprises forming the photoresist on the hardmask layer;
patterning the floating gate layer using the first photoresist mask to form a floating gate rail comprises anisotropically etching the hardmask layer and the floating gate layer during one etching step using the first photoresist mask;
forming the control gate dielectric layer comprises growing a thermal silicon oxide layer on the floating gate rail, depositing a silicon nitride layer on the thermal silicon oxide layer and depositing a silicon oxide layer on the silicon nitride layer;
forming the control gate layer over the control gate dielectric layer comprises depositing a polysilicon layer and a silicide layer on the control gate dielectric layer;
forming the second photoresist mask over the control gate layer comprises forming the second photoresist mask on the control gate layer; and
patterning the control gate layer, the control gate dielectric layer, the floating gate rail, the tunnel dielectric layer and the active area using the second photoresist mask comprises anisotropically etching the control gate layer, the control gate dielectric layer, the floating gate rail, the tunnel dielectric layer and the active layer in one etching step to form the second rail stacks.

34. A method of forming a monolithic three dimensional memory array, comprising:
providing a first array of floating gate EEPROM transistors of claim 28;
forming an interlayer insulating layer over the array; and
monolithically forming at least a second array of TFT EEPROMs on the interlayer insulating layer.

35. A method of forming a three dimensional memory array, comprising:
providing a plurality of arrays of floating gate EEPROM transistors of claim 28 on different silicon on insulator substrates;
thinning the substrates; and
attaching the arrays to each other to form a three dimensional memory array.

36. The method of claim 28 further comprising:
forming an interlayer insulating layer below the active area;
forming at least one via extending through the interlayer insulating layer to a lower device level or to a driver circuit in a substrate;
depositing at least a portion of a word line layer in the at least one via; and
patterning the word line layer to form the plurality of word lines and an interlevel interconnect which connects the array of transistors with a device on a lower device level or with a driver circuit in the substrate.

37. The method of claim 36 further comprising:
forming a heavily doped polysilicon layer comprising a lower portion of the word line layer;

forming the at least one via extending through the heavily doped polysilicon layer;

forming a conductive layer comprising an upper portion of the word line layer on the heavily doped polysilicon layer and in the at least one via; and patterning the heavily doped polysilicon layer and the conductive layer to form the plurality of word lines and the interlevel interconnect.

38. A method of making a floating gate transistor, comprising forming the entire floating gate transistor using two photolithographic masking steps wherein a channel island region and at least one of a control gate and a floating gate are etched using a same mask such that a semiconductor channel region of the floating gate transistor is formed in the etched channel island region, the method comprising:

providing a semiconductor active area;
forming a tunnel dielectric layer over the active area;
forming a floating gate layer over the tunnel dielectric layer;
forming a first photoresist mask over the floating gate layer in a first photolithographic masking step;
patterning the floating gate layer using the first photoresist mask to form a floating gate rail;
doping the active area using the floating gate rail as a mask to form source and drain regions in the active area;
forming an intergate insulating layer adjacent to lower portions of side surfaces of the floating gate rail;
forming a control gate dielectric layer over and adjacent to upper portions of the side surfaces of the floating gate rail;
forming a control gate layer over the control gate dielectric layer;
forming a second photoresist mask over the control gate layer in a second photolithographic masking step; and
patterning the control gate layer, the control gate dielectric layer, the floating gate rail, the tunnel dielectric layer and the active area using the second photoresist mask to form the control gate, a control gate dielectric, the floating gate, a tunnel dielectric and the channel island region.

39. The method of claim 38, wherein forming an intergate insulating layer adjacent to the side surfaces of the floating gate rail comprises:

forming the intergate insulating layer over and adjacent to the floating gate rail; and etching back the intergate insulating layer such that the intergate insulating layer remains adjacent to the lower portions of the floating gate rail side surfaces below the upper portions of the floating gate rail side surfaces.

40. The method of claim 39, further comprising:

forming a hardmask over the floating gate layer;
forming the first photoresist mask on the hardmask layer;
patterning the hardmask layer and the floating gate layer using the first photoresist mask to form a first rail stack comprising a hardmask rail and the floating gate rail;
implanting lightly doped portions of the source and drain regions using the first rail stack as a mask;
forming sidewall spacers on the first rail stack;
implanting heavily doped portions of the source and drain regions using the first rail stack and the sidewall spacers as a mask;
forming a metal layer over the source and drain regions and over the first rail stack;
annealing the first metal layer to react the metal layer with the source and drain regions to selectively form metal silicide regions on the source and drain regions; and
selectively etching the unreacted metal layer remaining on the sidewall spacers and the first rail stack.

41. The method of claim 40 further comprising:

selectively removing the hardmask and sidewall spacers from upper portions of the floating gate rail;
forming the control gate dielectric layer on the upper portions of the side surfaces of the floating gate rail and on the top surface of the floating gate rail; and
forming the control gate layer on the control gate dielectric layer such that the control gate layer is located over the top surface of the floating gate rail and laterally adjacent to the upper portions of the side surfaces of the floating gate rail.

42. The method of claim 28, wherein the step of forming the intergate insulating layer occurs after the step of doping the active area.

* * * * *

UNITED STATES PATENT AND TRADEMARK OFFICE
CERTIFICATE OF CORRECTION

PATENT NO.       : 7,615,436 B2
APPLICATION NO.  : 10/849152
DATED            : November 10, 2009
INVENTOR(S)      : Kouznetsov et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 649 days.

Signed and Sealed this

Fourteenth Day of December, 2010

David J. Kappos
*Director of the United States Patent and Trademark Office*